(12) United States Patent
Alleyne et al.

(10) Patent No.: US 8,269,317 B2
(45) Date of Patent: Sep. 18, 2012

(54) PHOSPHORESCENT MATERIALS

(75) Inventors: Bert Alleyne, Monroeville, PA (US); Raymond Kwong, Plainsboro, NJ (US)

(73) Assignee: Universal Display Corporation, Ewing, NJ (US)

( * ) Notice: Subject to any disclaimer, the term of this patent is extended or adjusted under 35 U.S.C. 154(b) by 55 days.

(21) Appl. No.: 12/944,437

(22) Filed: Nov. 11, 2010

(65) Prior Publication Data

US 2012/0119190 A1    May 17, 2012

(51) Int. Cl.
*H01L 23/58* (2006.01)
(52) U.S. Cl. ... 257/643; 257/40; 257/347; 257/E21.007; 257/E21.32; 257/E21.266; 257/E21.352; 257/E21.053; 257/E33.001; 257/E33.054
(58) Field of Classification Search ............ 257/643, 257/347, 656, 676, 792, 40, E21.007, E21.32, 257/E21.266, E21.352, E33.001, E33.054
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,528,187 B1 | 3/2003 | Okada | |
| 6,687,266 B1 | 2/2004 | Ma et al. | |
| 6,835,469 B2 | 12/2004 | Kwong et al. | |
| 6,921,915 B2 | 7/2005 | Takiguchi et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |

(Continued)

FOREIGN PATENT DOCUMENTS

EP    0650955    5/1995

(Continued)

OTHER PUBLICATIONS

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

(Continued)

*Primary Examiner* — David Nhu
(74) *Attorney, Agent, or Firm* — Kilpatrick Townsend & Stockton LLP

(57) ABSTRACT

Compounds comprising a ligand having a quinoline or isoquinoline moiety and a phenyl moiety, e.g., (iso)pq ligands. In particular, the ligand is further substituted with electron donating groups. The compounds may be used in organic light emitting devices, particularly devices with emission in the deep red part of the visible spectrum, to provide devices having improved properties.

28 Claims, 3 Drawing Sheets

U.S. PATENT DOCUMENTS

| | | | |
|---|---|---|---|
| 7,250,226 B2 | 7/2007 | Tokito et al. | |
| 7,279,704 B2 * | 10/2007 | Walters et al. | 257/40 |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,445,855 B2 | 11/2008 | Mackenzie et al. | |
| 7,534,505 B2 | 5/2009 | Lin et al. | |
| 2002/0034656 A1 | 3/2002 | Thompson et al. | |
| 2002/0134984 A1 | 9/2002 | Igarashi | |
| 2002/0158242 A1 | 10/2002 | Son et al. | |
| 2003/0138657 A1 | 7/2003 | Li et al. | |
| 2003/0152802 A1 | 8/2003 | Tsuboyama et al. | |
| 2003/0162053 A1 | 8/2003 | Marks et al. | |
| 2003/0175553 A1 | 9/2003 | Thompson et al. | |
| 2003/0230980 A1 | 12/2003 | Forrest et al. | |
| 2004/0036077 A1 | 2/2004 | Ise | |
| 2004/0137267 A1 | 7/2004 | Igarashi et al. | |
| 2004/0137268 A1 | 7/2004 | Igarashi et al. | |
| 2004/0174116 A1 | 9/2004 | Lu et al. | |
| 2005/0025993 A1 | 2/2005 | Thompson et al. | |
| 2005/0112407 A1 | 5/2005 | Ogasawara et al. | |
| 2005/0238919 A1 | 10/2005 | Ogasawara | |
| 2005/0244673 A1 | 11/2005 | Satoh et al. | |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0202194 A1 | 9/2006 | Jeong et al. | |
| 2006/0240279 A1 | 10/2006 | Adamovich et al. | |
| 2006/0251923 A1 | 11/2006 | Lin et al. | |
| 2006/0263635 A1 | 11/2006 | Ise | |
| 2006/0280965 A1 | 12/2006 | Kwong et al. | |
| 2007/0190359 A1 | 8/2007 | Knowles et al. | |
| 2007/0278938 A1 | 12/2007 | Yabunouchi et al. | |
| 2008/0015355 A1 | 1/2008 | Schafer et al. | |
| 2008/0018221 A1 | 1/2008 | Egen et al. | |
| 2008/0106190 A1 | 5/2008 | Yabunouchi et al. | |
| 2008/0124572 A1 | 5/2008 | Mizuki et al. | |
| 2008/0220265 A1 | 9/2008 | Xia et al. | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Prakash et al. | |
| 2009/0108737 A1 | 4/2009 | Kwong et al. | |
| 2009/0115316 A1 | 5/2009 | Zheng et al. | |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |

FOREIGN PATENT DOCUMENTS

| | | |
|---|---|---|
| EP | 1239526 | 9/2002 |
| EP | 1348711 | 10/2003 |
| EP | 1725079 | 11/2006 |
| EP | 2034538 | 3/2009 |
| GB | 2404380 | 2/2005 |
| JP | 200511610 | 1/2005 |
| JP | 2006080419 | 3/2006 |
| JP | 2007123392 | 5/2007 |
| JP | 2007254297 | 10/2007 |
| JP | 2007262134 | 10/2007 |
| JP | 2008074939 | 10/2009 |
| KR | 2008105870 | 1/2008 |
| WO | WO 0139234 | 5/2001 |
| WO | WO 0202714 | 1/2002 |
| WO | WO 0215645 | 2/2002 |
| WO | WO 02/081488 | 10/2002 |
| WO | WO 03040257 | 5/2003 |
| WO | WO 03060956 | 7/2003 |
| WO | WO 2004093207 | 10/2004 |
| WO | WO 2004107822 | 12/2004 |
| WO | WO 2005014551 | 2/2005 |
| WO | WO 2005019373 | 3/2005 |
| WO | WO 2005030900 | 4/2005 |
| WO | WO 2005/073339 | 8/2005 |
| WO | WO 2005089025 | 9/2005 |
| WO | WO 2005123873 | 12/2005 |
| WO | WO 2006009024 | 1/2006 |
| WO | WO 2006056418 | 6/2006 |
| WO | WO 2006072002 | 7/2006 |
| WO | WO 2006082742 | 8/2006 |
| WO | WO 2006098120 | 9/2006 |
| WO | WO 2006100298 | 9/2006 |
| WO | WO 2006103874 | 10/2006 |
| WO | WO 2006114966 | 11/2006 |
| WO | WO 2006132173 | 12/2006 |
| WO | WO 2007002683 | 1/2007 |
| WO | WO 2007004380 | 1/2007 |
| WO | WO 2007063754 | 6/2007 |
| WO | WO 2007063796 | 6/2007 |
| WO | WO 2008056746 | 5/2008 |
| WO | WO 2008101842 | 8/2008 |
| WO | WO 2008132085 | 11/2008 |
| WO | WO 2009000673 | 12/2008 |
| WO | WO 2009003898 | 1/2009 |
| WO | WO 2009008311 | 1/2009 |
| WO | WO 2009018009 | 2/2009 |
| WO | WO 2009050290 | 4/2009 |
| WO | WO 2009021126 | 5/2009 |
| WO | WO 2009062578 | 5/2009 |
| WO | WO 2009063833 | 5/2009 |
| WO | WO 2009066778 | 5/2009 |
| WO | WO 2009066779 | 5/2009 |
| WO | WO 2009086028 | 7/2009 |
| WO | WO 2009100991 | 8/2009 |
| WO | WO 2010/033550 | 3/2010 |

OTHER PUBLICATIONS

Paulose, Betty Marie Jennifer S. et al., "First Examples of Alkenyl Pyridines as Organic Ligands for Phosphorescent Iridium Complexes," *Adv. Mater.*, 16(22):2003-2007 (2004).

Tung, Yung-Liang et al., "Organic Light-Emitting Diodes Based on Charge-Neutral Ru$^{II}$ PHosphorescent Emitters," Adv. Mater., 17(8):1059-1064 (2005).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," *Adv. Mater.*, 19:739-743 (2007).

Wong, Wai-Yeung, "Multifunctional Iridium Complexes Based on Carbazole Modules as Highly Efficient Electrophosphors," *Angew. Chem. Int. Ed.*, 45:7800-7803 (2006).

Tang, C.W. and VanSlyke, S.A., "Organic Electroluminescent Diodes," *Appl. Phys. Lett.*, 51(12):913-915 (1987).

Adachi, Chihaya et al., "Organic Electroluminescent Device Having a Hole Conductor as an Emitting Layer," *Appl. Phys. Lett.*, 55(15):1489-1491 (1989).

Ma, Yuguang et al., "Triplet Luminescent Dinuclear-Gold(I) Complex-Based Light-Emitting Diodes with Low Turn-On voltage," *Appl. Phys. Lett.*, 74(10):1361-1363 (1999).

Gao, Zhiqiang et al., "Bright-Blue Electroluminescence From a Silyl-Substituted ter-(phenylene-vinylene) derivative," *Appl. Phys. Lett.*, 74(6):865-867 (1999).

Lee, Chang-Lyoul et al., "Polymer Phosphorescent Light-Emitting Devices Doped with Tris(2-phenylpyridine) Iridium as a Triplet Emitter," *Appl. Phys. Lett.*, 77(15):2280-2282 (2000).

Hung, L.S. et al., "Anode Modification in Organic Light-Emitting Diodes by Low-Frequency Plasma Polymerization of $CHF_3$," *Appl. Phys. Lett.*, 78(5):673-675 (2001).

Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).

Wang, Y. et al., "Highly Efficient Electroluminescent Materials Based on Fluorinated Organometallic Iridium Compounds," *Appl. Phys. Lett.*, 79(4):449-451 (2001).

Kwong, Raymond C. et al., "High Operational Stability of Electrophosphorescent Devices," *Appl. Phys. Lett.*, 81(1):162-164 (2002).

Holmes, R.J. et al., "Blue Organic Electrophosphorescence Using Exothermic Host-Guest Energy Transfer," *Appl. Phys. Lett.*, 82(15):2422-2424 (2003).

Sotoyama, Wataru et al., "Efficient Organic Light-Emitting Diodes with Phosphorescent Platinum Complexes Containing N^C^N-Coordinating Tridentate Ligand," *Appl. Phys. Lett.*, 86:153505-1-153505-3 (2005).

Okumoto, Kenji et al., "Green Fluorescent Organic Light-Emitting Device with External Quantum Efficiency of Nearly 10%," *Appl. Phys. Lett.*, 89:063504-1-063504-3 (2006).

Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).

Aonuma, Masaki et al., "Material Design of Hole Transport Materials Capable of Thick-Film Formation in Organic Light Emitting Diodes," *Appl. Phys. Lett.*, 90:183503-1-183503-3 (2007).

Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).

Adachi, Chihaya et al., "High-Efficiency Red Electrophosphorescence Devices," *Appl. Phys. Lett.*, 78(11):1622-1624 (2001).

Wong, Keith Man-Chung et al., A Novel Class of Phosphorescent Gold(III) Alkynyl-Based Organic Light-Emitting Devices with Tunable Colour, *Chem. Commun.*, 2906-2908 (2005).

Hamada, Yuji et al., "High Luminance in Organic Electroluminescent Devices with Bis(10-hydroxybenzo[h]quinolinato)beryllium as an Emitter," *Chem. Lett.*, 905-906 (1993).

Nishida, Jun-ichi et al., "Preparation, Characterization, and Electroluminescence Characteristics of α-Diimine-type Platinum(II) Complexes with Perfluorinated Phenyl Groups as Ligands," *Chem. Lett.*, 34(4):592-593 (2005).

Mi, Bao-Xiu et al., "Thermally Stable Hole-Transporting Material for Organic Light-Emitting Diode: an Isoindole Derivative," *Chem. Mater.*, 15(16):3148-3151 (2003).

Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).

Niu, Yu-Hua et al., "Highly Efficient Electrophosphorescent Devices with Saturated Red Emission from a Neutral Osmium Complex," *Chem. Mater.*, 17(13):3532-3536 (2005).

Lo, Shih-Chun et al., "Blue Phosphorescence from Iridium(III) Complexes at Room Temperature," *Chem. Mater.*, 18(21):5119-5129 (2006).

Takizawa, Shin-ya et al., "Phosphorescent Iridium Complexes Based on 2-Phenylimidazo[1,2-α]pyridine Ligands: Tuning of Emission Color toward the Blue Region and Application to Polymer Light-Emitting Devices," *Inorg. Chem.*, 46(10):4308-4319 (2007).

Lamansky, Sergey et al., "Synthesis and Characterization of Phosphorescent Cyclometalated Iridium Complexes," *Inorg. Chem.*, 40(7):1704-1711 (2001).

Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).

Noda, Tetsuya and Shirota, Yasuhiko, "5,5'-Bis(dimesitylboryl)-2,2'-bithiophene and 5,5''-Bis(dimesitylboryl)-2,2':5',2''-terthiophene as a Novel Family of Electron-Transporting Amorphous Molecular Materials," *J. Am. Chem. Soc.*, 120 (37):9714-9715 (1998).

Sakamoto, Youichi et al., "Synthesis, Characterization, and Electron-Transport Property of Perfluorinated Phenylene Dendrimers," *J. Am. Chem. Soc.*, 122(8):1832-1833 (2000).

Adachi, Chihaya et al., "Nearly 100% Internal Phosphorescence Efficiency in an Organic Light Emitting Device," *J. Appl. Phys.*, 90(10):5048-5051 (2001).

Shirota, Yasuhiko et al., "Starburst Molecules Based on π-Electron Systems as Materials for Organic Electroluminescent Devices," *Journal of Luminescence*, 72-74:985-991 (1997).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).

Kido, Junji et al., 1,2,4-Triazole Derivative as an Electron Transport Layer in Organic Electroluminescent Devices, *Jpn. J. Appl. Phys.*, 32:L917-L920 (1993).

Van Slyke, S. A. et al., "Organic Electroluminescent Devices with Improved Stability," *Appl. Phys. Lett.*, 69(15):2160-2162 (1996).

Guo, Tzung-Fang et al., "Highly Efficient Electrophosphorescent Polymer Light-Emitting Devices," *Organic Electronics*, 1:15-20 (2000).

Palilis, Leonidas C., "High Efficiency Molecular Organic Light-Emitting Diodes Based on Silole Derivatives and Their Exciplexes," *Organic Electronics*, 4:113-121 (2003).

Ikeda, Hisao et al., "P-185: Low-Drive-Voltage OLEDs with a Buffer Layer Having Molybdenum Oxide," *SID Symposium Digest*, 37:923-926 (2006).

T. Östergård et al., "Langmuir-Blodgett Light-Emitting Diodes of Poly(3-Hexylthiophene): Electro-Optical Characteristics Related to Structure," *Synthetic Metals*, 87:171-177 (1997).

Hu, Nan-Xing et al., "Novel High $T_g$ Hole-Transport Molecules Based on Indolo[3,2-b]carbazoles for Organic Light-Emitting Devices," *Synthetic Metals*, 111-112:421-424 (2000).

Salbeck, J. et al., "Low Molecular Organic Glasses for Blue Electroluminescence," *Synthetic Metals*, 91:209-215 (1997).

Baldo et al., "Highly Efficient Phosphorescent Emission from Organic Electroluminescent Devices," *Nature*, vol. 395, 151-154, (1998).

Baldo et al., "Very high-efficiency green organic light-emitting devices based on electrophosphorescence," Appl. Phys. Lett., vol. 75, No. 3, 4-6 (1999).

The International Search Report corresponding to the PCT/US2011/057518 application.

Tsuzuki et al.: "Color tunable organic light-emitting diodes using pentafluorophenyl-substituted iridium complexes", Advanced Materials, DE, vol. 15, No. 17, Jan. 1, 2003 pp. 1455-1458.

* cited by examiner

PHOSPHORESCENT MATERIALS

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs). More specifically, the present invention related to phosphorescent materials comprising a ligand having a quinoline or isoquinoline moiety and a phenyl moiety, e.g., (iso)pq ligands, which is further substituted with electron donating groups. These materials may provide devices having improved performance.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure:

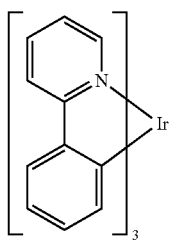

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

Compounds are provided having the formula:

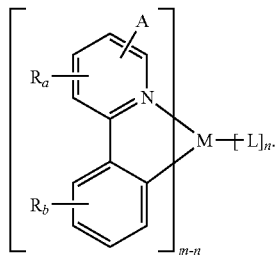

Formula I

M is a metal having an atomic weight higher than 40. L is an ancillary ligand. m is the oxidation state of the metal M. Preferably, M is Ir. n is at least 1. A is a fused carbocyclic or fused heterocyclic ring. Each of $R_a$ and $R_b$ may represent mono, di, tri, or tetra substituents. Each $R_a$ substituent is independently selected from the group consisting of hydrogen, deuterium, alkyl, heteroalkyl, aryl or heteroaryl groups. Each $R_b$ substituent is independently selected from the group consisting of hydrogen, deuterium, alkyl, heteroalkyl, aryl or heteroaryl groups. At least two $R_b$ substituents are selected from the group consisting of alkoxy, aryloxy, alkyl amino, and aryl amino.

Preferably, L is a monoanionic bidentate ligand. More preferably, L is

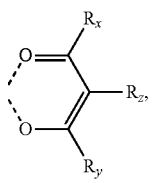

and $R_x$, $R_y$, and $R_z$ are each independently selected from the group consisting of hydrogen, deuterium, alkyl, heteroalkyl, aryl or heteroaryl groups. Most preferably, at least one of $R_x$ and $R_y$ contains a branched alkyl moiety with branching at a position further than the α position to the carbonyl group. In one aspect, at least one of $R_x$ and $R_y$ is isobutyl. In another aspect, $R_z$ is hydrogen.

In one aspect, the compound has a formula selected from the group consisting of:

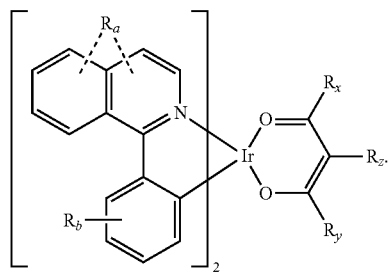

Formula II

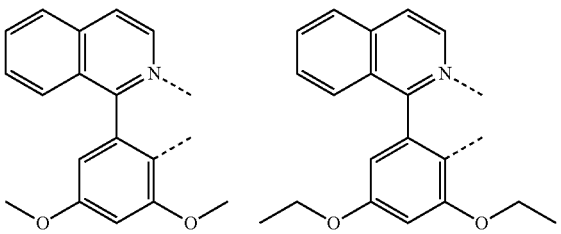

Formula III

In another aspect, the (iso)pq ligand is selected from the group consisting of:

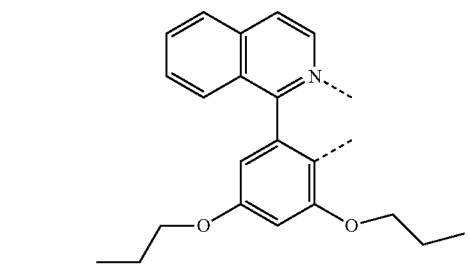

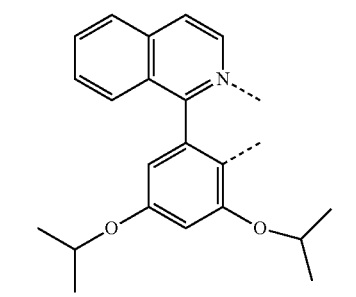

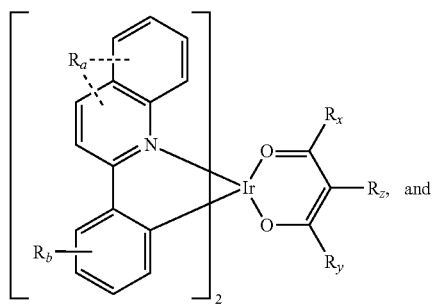

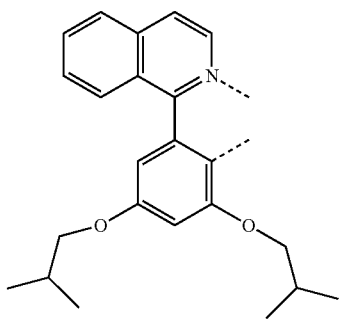

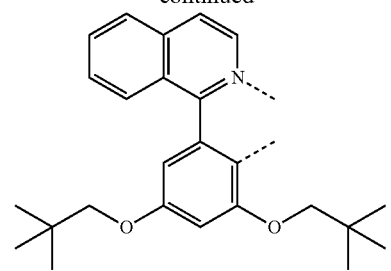
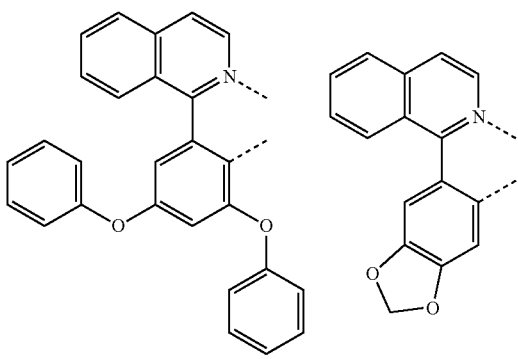
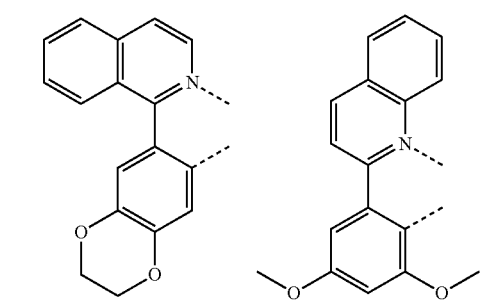
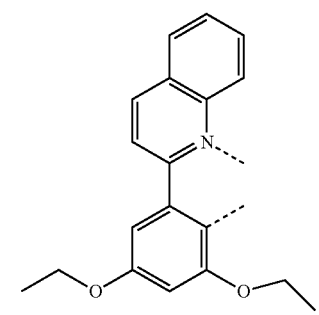
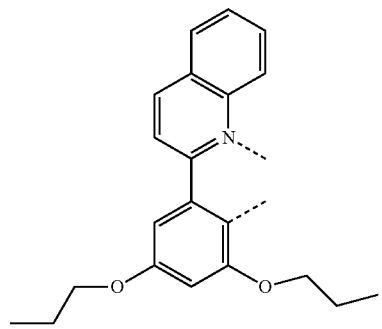
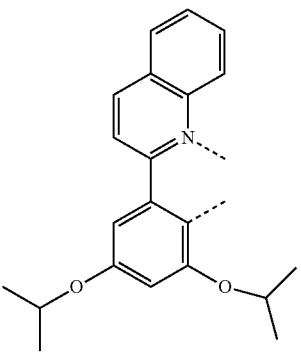
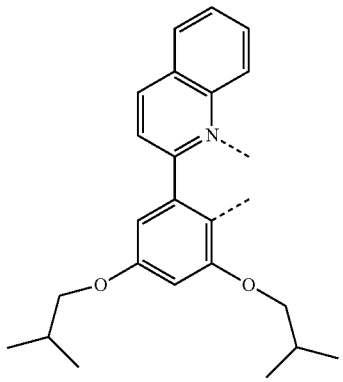
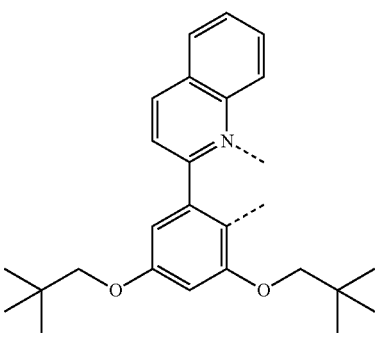
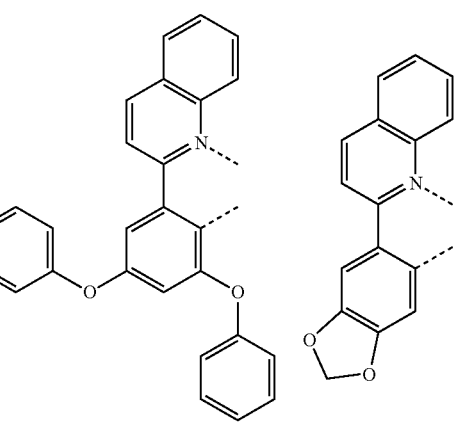

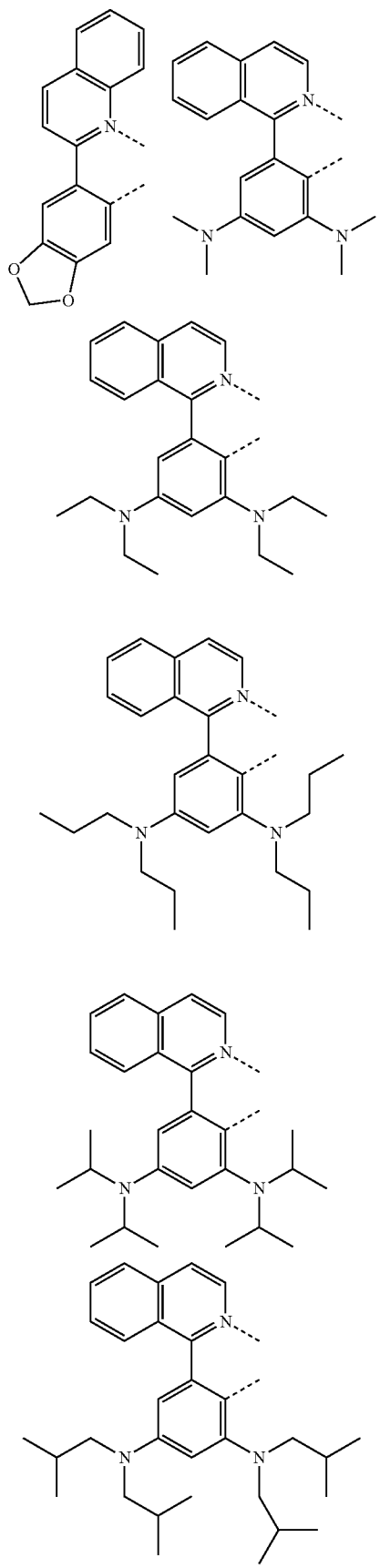
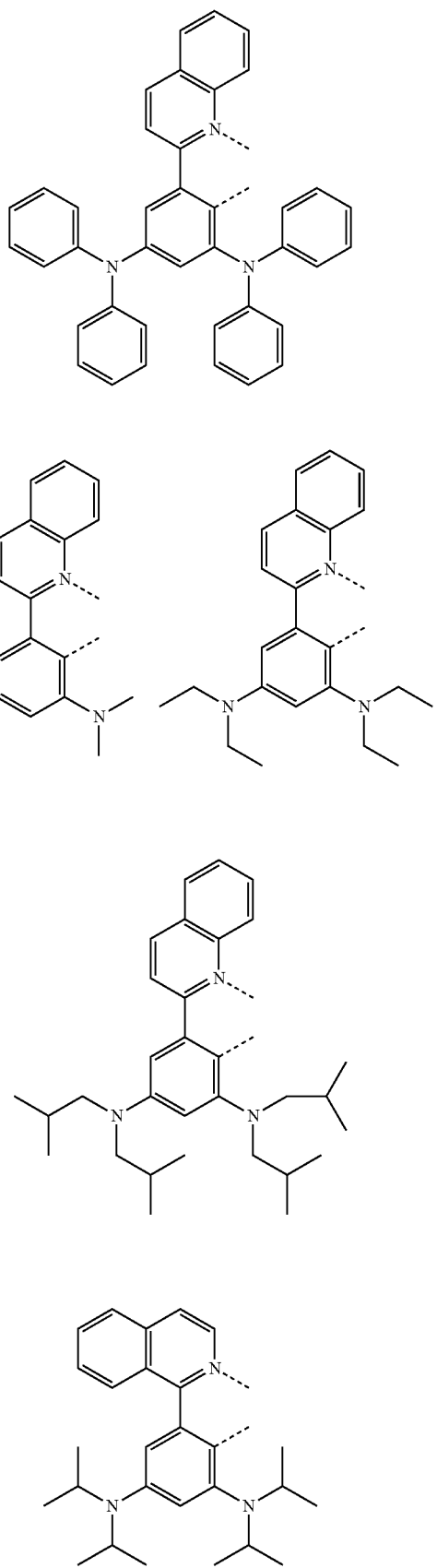

-continued

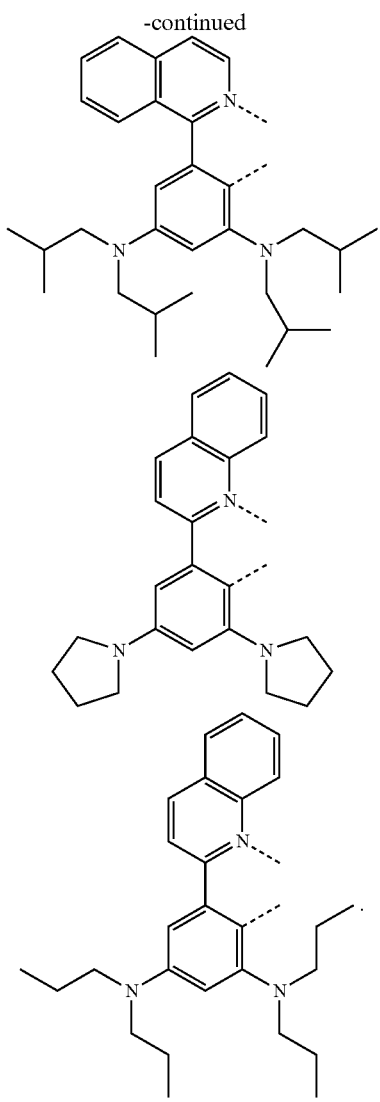

Specific compounds are also provided. In particular, the compound is selected from the group consisting of Compound 1-Compound 7.

In one aspect, the compound has an emissive spectrum having a peak wavelength of about 650 nm to about 700 nm.

A first device comprising an organic light emitting device is also provided. The organic light emitting device further comprises an anode, a cathode, and an organic layer disposed between the anode and the cathode. The organic layer comprises a compound having the formula:

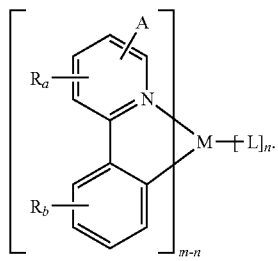

Formula I

M is a metal having an atomic weight higher than 40. Preferably, M is Ir. L is an ancillary ligand. m is the oxidation state of the metal M. n is at least 1. A is a fused carbocyclic or fused heterocyclic ring. Each of $R_a$ and $R_b$ may represent mono, di, tri, or tetra substituents. Each $R_a$ substituent is independently selected from the group consisting of hydrogen, deuterium, alkyl, heteroalkyl, aryl or heteroaryl groups. Each $R_b$ substituent is independently selected from the group consisting of hydrogen, deuterium, alkyl, heteroalkyl, aryl or heteroaryl groups. At least two $R_b$ substituents are selected from the group consisting of alkoxy, aryloxy, alkyl amino, and aryl amino.

Specific examples of devices comprising inventive compounds are provided. In one aspect, the compound used in the first device is selected form the group consisting of Compound 1-Compound 7.

The various specific aspects discussed above for Formula I are also applicable to a compound having Formula I when used in the first device. In particular, specific aspects of M, L, $R_a$, $R_b$, $R_x$, $R_y$, $R_z$, and the (iso)pq ligand moiety of the compound having Formula I discussed above are also applicable to a compound having Formula I that is used in the first device.

In one aspect, the organic layer is an emissive layer and the compound having Formula I is an emitting dopant. In another aspect, the organic layer further comprises a host. Preferably, the host is a metal 8-hydroxyquinolate. More preferably, the host is:

Compound D

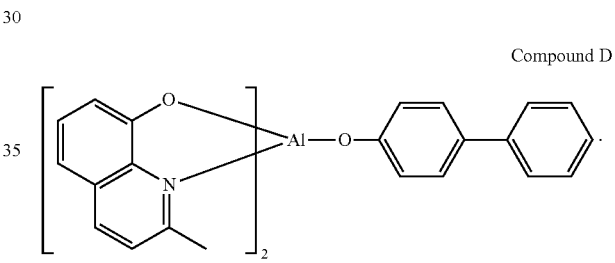

In one aspect, the first device is a consumer product. In another aspect, the first device is an organic light emitting device.

In one aspect, the device comprises a compound having an emissive spectrum having a peak wavelength of about 650 nm to about 700 nm.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
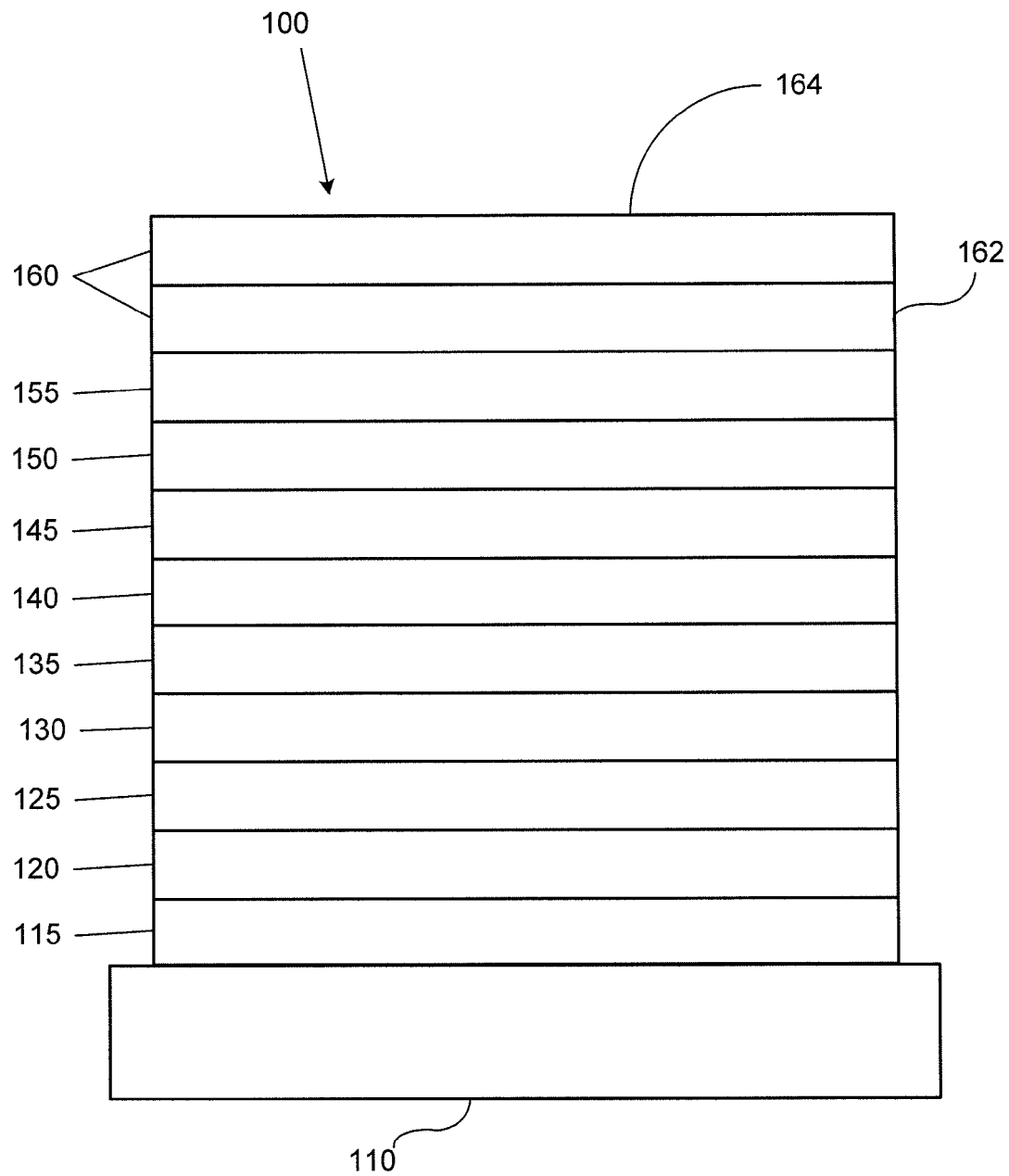
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
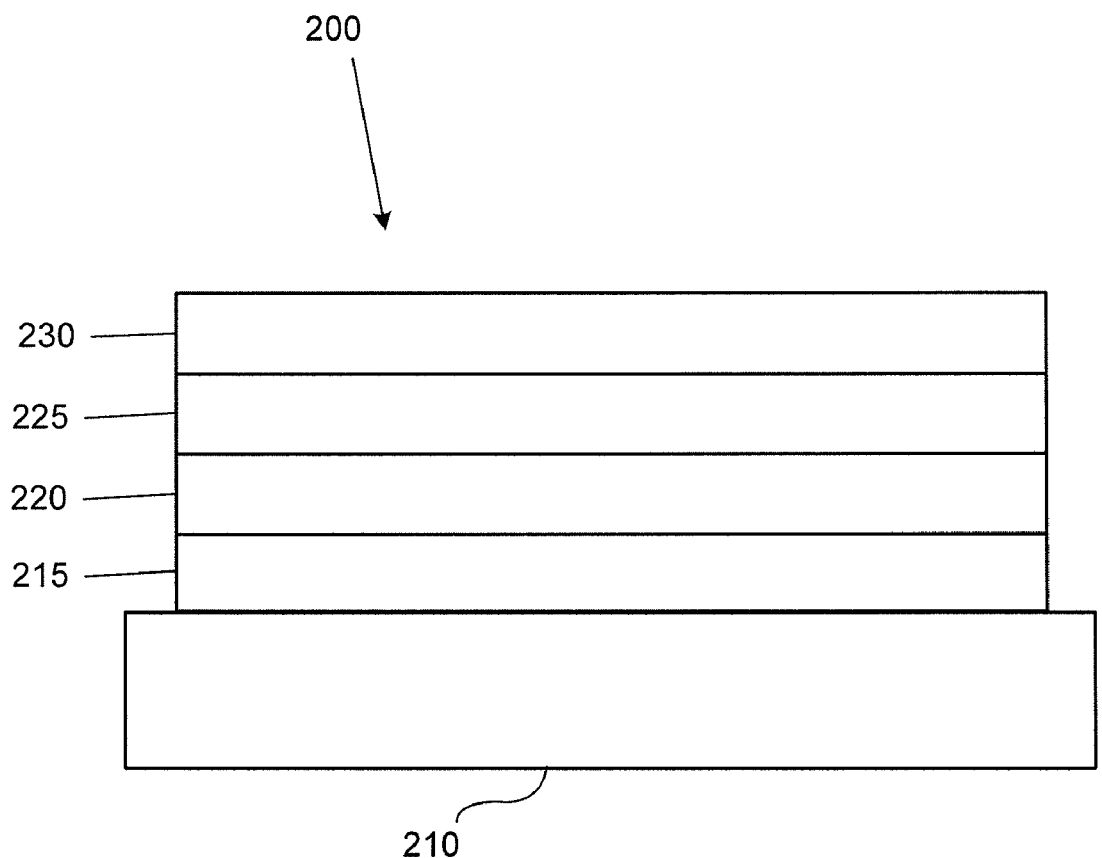
FIG. 2 shows an inverted organic light emitting device that does not have a separate electron transport layer.
Figure 3:
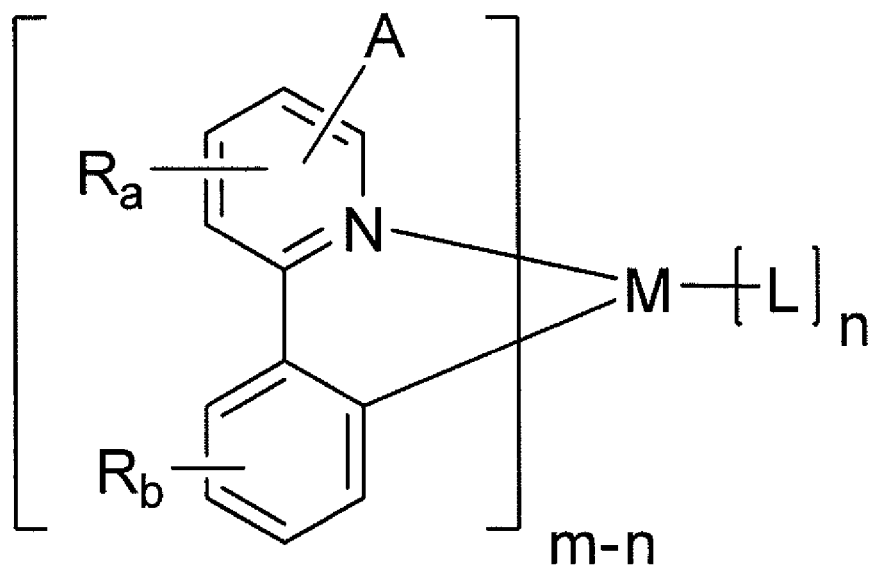
FIG. 3 shows an exemplary phosphorescent material comprising a quinoline or isoquinoline phenyl ligand further substituted with electron donating groups.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Using Ir(3-Meppy)$_3$ as a base structure, different alkyl substitution patterns on both the emitting ligand and the ancillary ligand have been previously studied to establish a structure-property relationship with respect to material processibility (evaporation temperature, evaporation stability, solubility, etc) and device characteristics of Ir(2-phenylquinoline) and Ir(1-phenylisoquinoline) type phosphorescent materials and their PHOLEDs. Alkyl substitutions are particularly important because they offer a wide range of tunability in terms of evaporation temperature, solubility, energy levels, device efficiency and narrowness of the emission spectrum. Moreover, they are stable functional groups chemically and in device operation when applied appropriately. Strong electron donating or electron withdrawing substituents on the emitting ligand can even further tune the emission energy of the complexes. In an effort to create phosphorescent emitters with very deep red emission, a variety of electron donating groups on the emitting ligand were studied to determine the extent of the red shifting effect.

The compounds provided herein exhibit very deep red emission in the range of 650 nm to 700 nm. Very deep red emission is useful for certain display applications requiring an emission wavelength between 650 nm and 700 nm. In particular, these compounds may be especially useful in OLED displays or other displays requiring very deep red emission.

The compounds disclosed herein comprise a ligand having an quinoline or isoquinoline moiety and a phenyl moiety, e.g., (iso)pq ligands. The (iso)pq ligand provides red emission. The phenyl moiety of the (iso)pq ligand is further substituted with electron donating groups, including alkoxy, aryloxy and amino groups. Without being bound by theory, it is believed that substitution of the (iso)pq ligand with electron donating groups causes further red shifting and, thus, very deep red emission.

Compounds are provided having the formula:

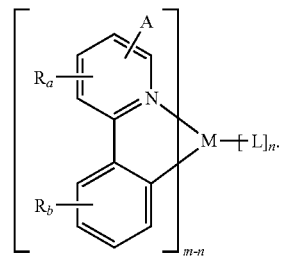

Formula I

M is a metal having an atomic weight higher than 40. L is an ancillary ligand. m is the oxidation state of the metal M. Preferably, M is Ir. n is at least 1. A is a fused carbocyclic or fused heterocyclic ring. By fused, it is meant that A is a carbocyclic or heterocyclic ring that is fused to the pyridine ring of the phenyl pyridine moiety in the compound. A may be further substituted. Fusing A to the pyridine ring results in an (iso)pq ligand, as discussed above. Each of $R_a$ and $R_b$ may represent mono, di, tri, or tetra substituents. Each $R_a$ substituent is independently selected from the group consisting of hydrogen, deuterium, alkyl, heteroalkyl, aryl or heteroaryl groups. Each $R_b$ substituent is independently selected from the group consisting of hydrogen, deuterium, alkyl, heteroalkyl, aryl or heteroaryl groups. At least two $R_b$ substituents are selected from the group consisting of alkoxy, aryloxy, alkyl amino, and aryl amino.

Preferably, L is a monoanionic bidentate ligand. More preferably, L is

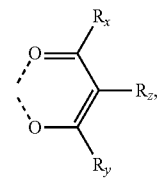

and $R_x$, $R_y$, and $R_z$ are each independently selected from the group consisting of hydrogen, deuterium, alkyl, heteroalkyl, aryl or heteroaryl groups. Most preferably, at least one of $R_x$ and $R_y$ contains a branched alkyl moiety with branching at a position further than the α position to the carbonyl group. The α position refers to the first carbon that attaches to a functional group. In one aspect, at least one of $R_x$ and $R_y$ is isobutyl. In another aspect, $R_z$ is hydrogen.

In one aspect, the compound has a formula selected from the group consisting of:

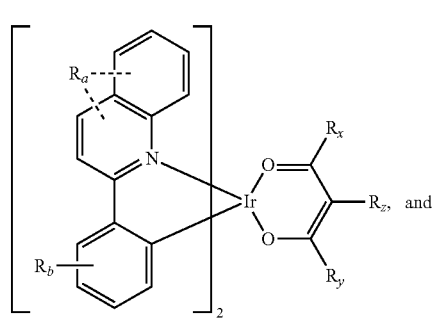

Formula II and

-continued
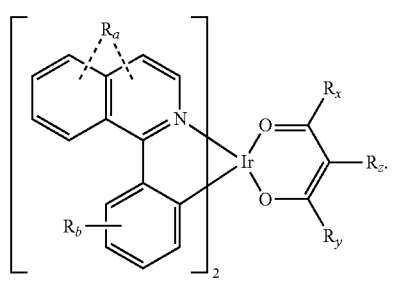
Formula III
In another aspect, the (iso)pq ligand is selected from the group consisting of:
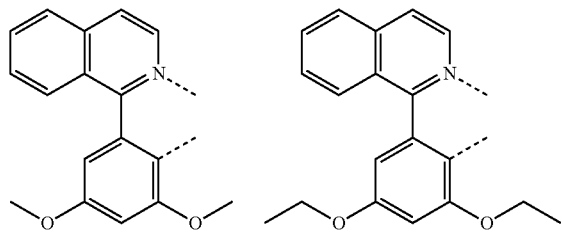
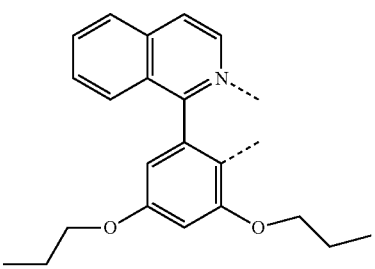
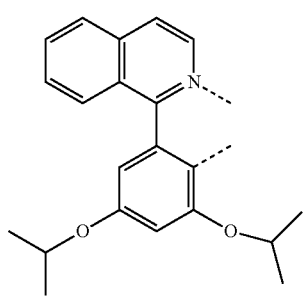
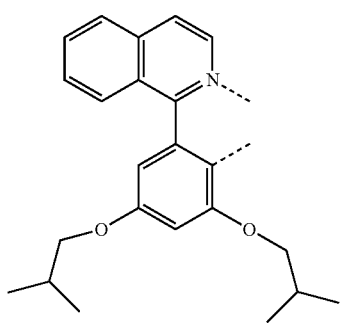
-continued
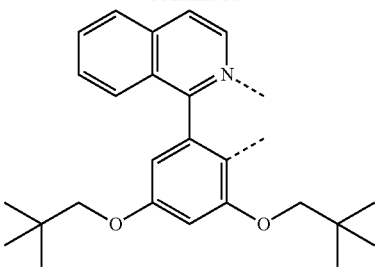
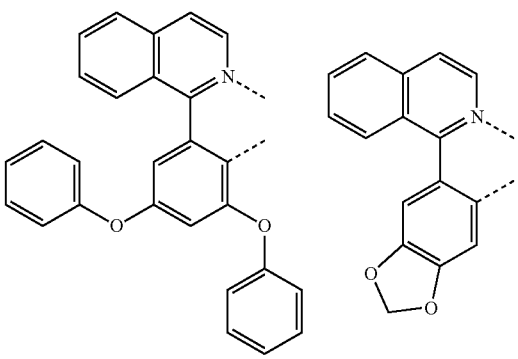
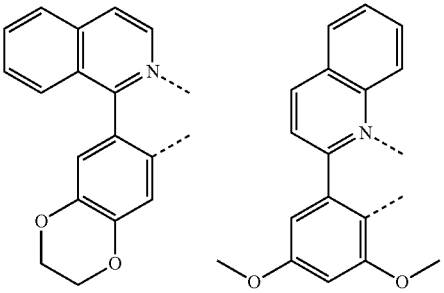
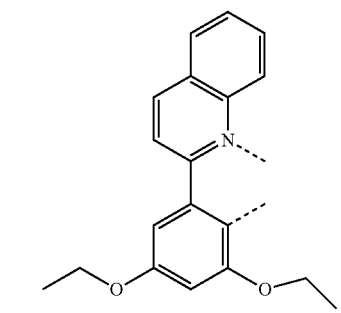
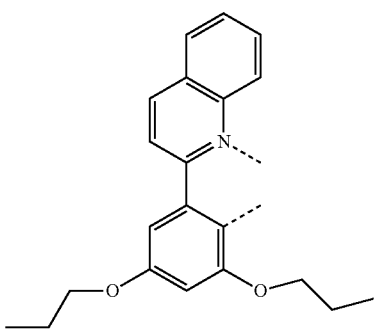

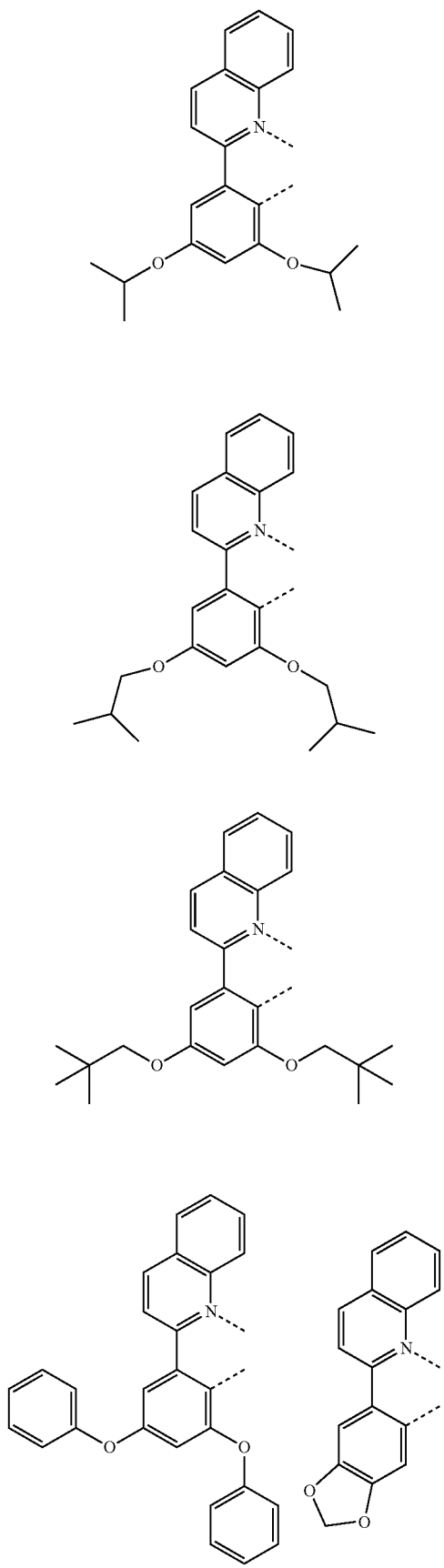
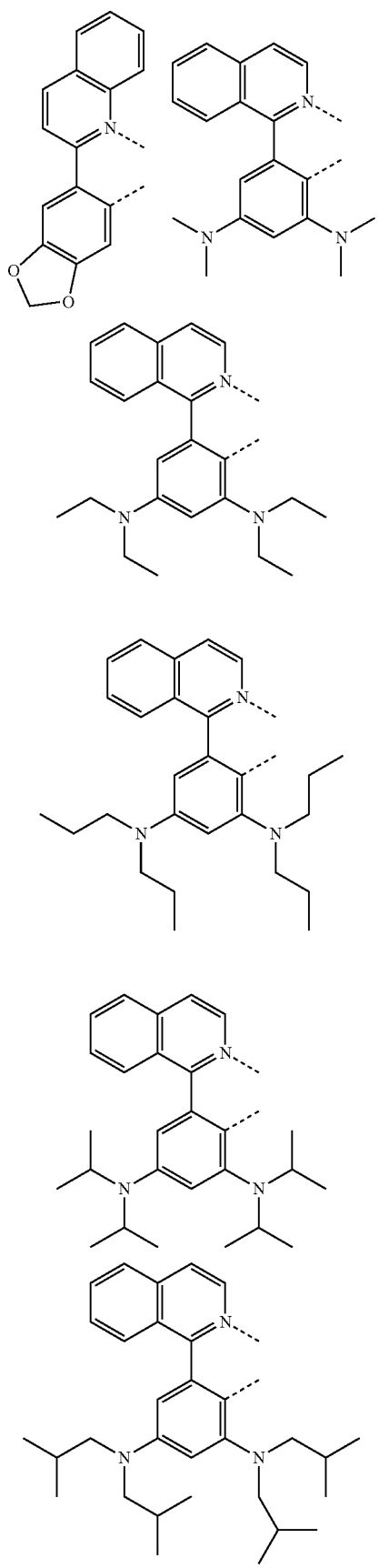

-continued
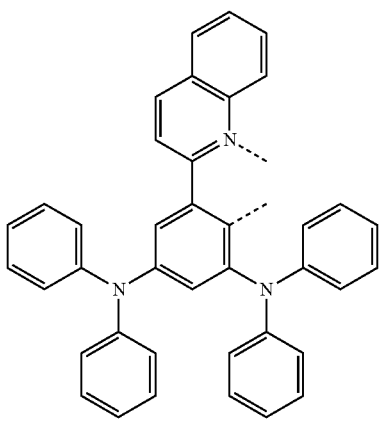
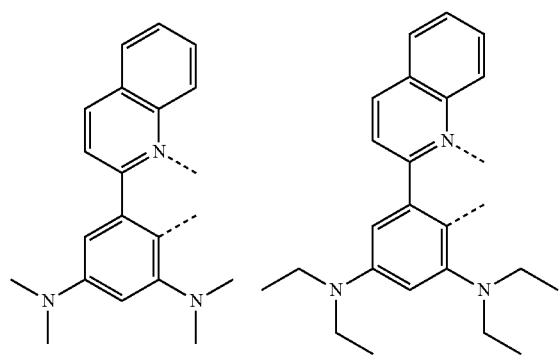
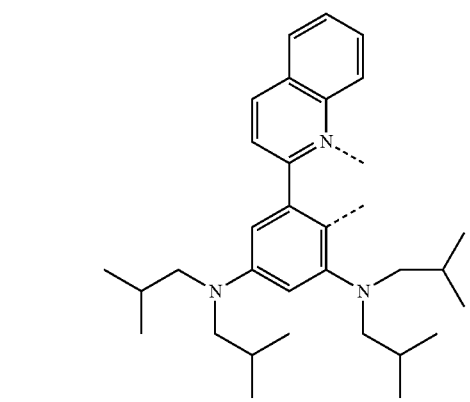
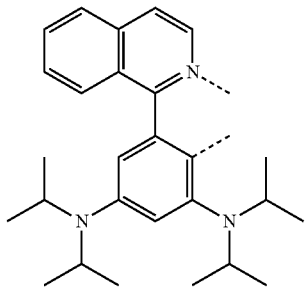
-continued
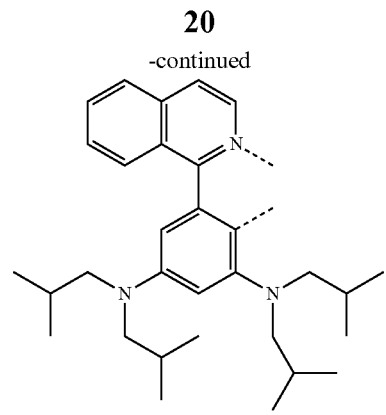
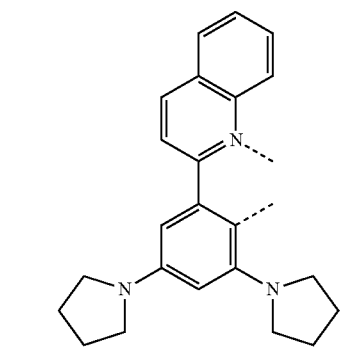
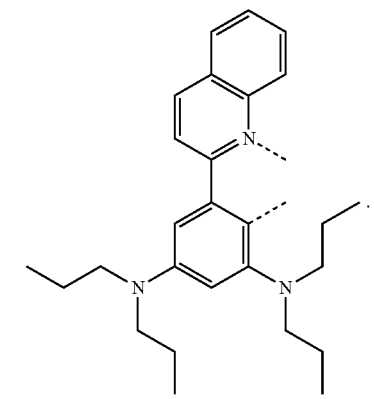
Specific compounds are also provided. In particular, the compound is selected from the group consisting of:
Compound 1
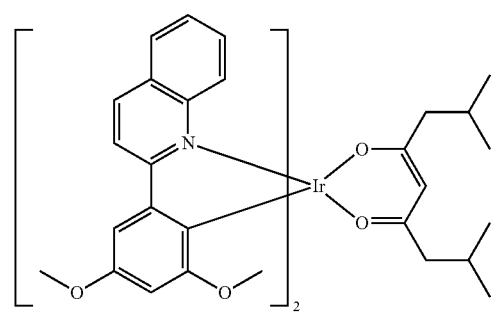

Compound 2

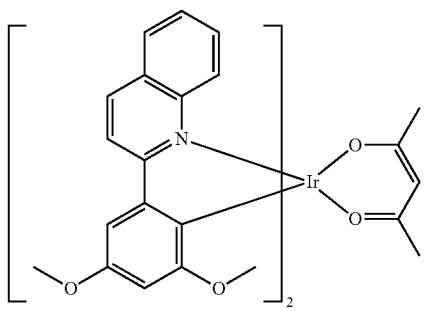

Compound 3

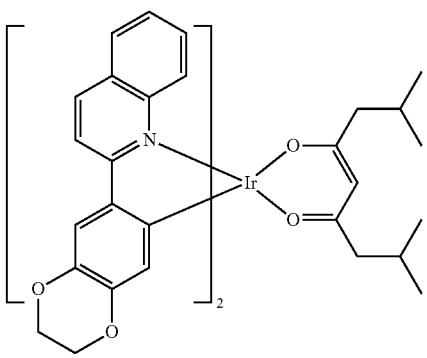

Compound 4

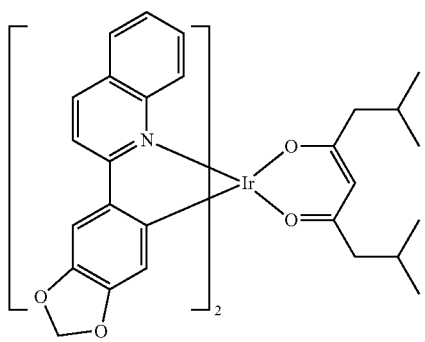

Compound 5

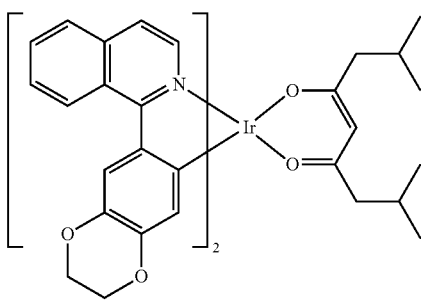

Compound 6

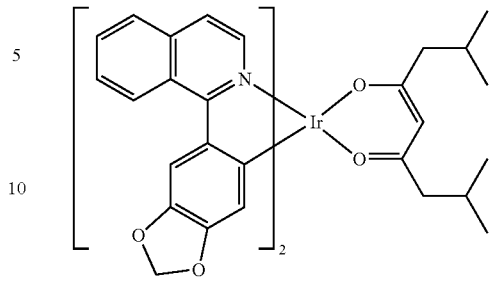

Compound 7

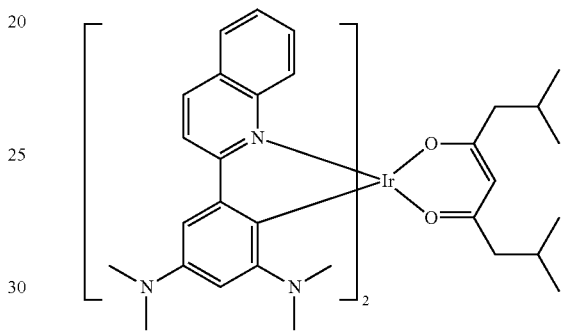

In one aspect, the compound has an emissive spectrum having a peak wavelength of about 650 nm to about 700 nm.

A first device comprising an organic light emitting device is also provided. The organic light emitting device further comprises an anode, a cathode, and an organic layer disposed between the anode and the cathode. The organic layer comprises a compound having the formula:

Formula I

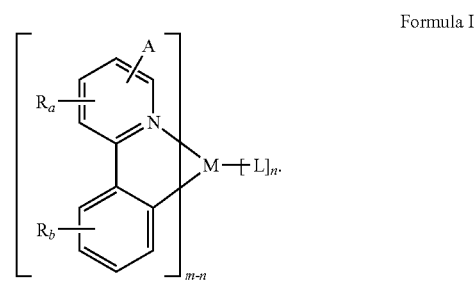

M is a metal having an atomic weight higher than 40. Preferably, M is Ir. L is an ancillary ligand. m is the oxidation state of the metal M. n is at least 1. A is a fused carbocyclic or fused heterocyclic ring, as discussed above. Each of $R_a$ and $R_b$ may represent mono, di, tri, or tetra substituents. Each $R_a$ substituent is independently selected from the group consisting of hydrogen, deuterium, alkyl, heteroalkyl, aryl or heteroaryl groups. Each $R_b$ substituent is independently selected from the group consisting of hydrogen, deuterium, alkyl, heteroalkyl, aryl or heteroaryl groups. At least two $R_b$ substituents are selected from the group consisting of alkoxy, aryloxy, alkyl amino, and aryl amino.

Preferably, L is a monoanionic bidentate ligand. More preferably, L is

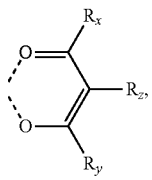

and $R_x$, $R_y$, and $R_z$ are each independently selected from the group consisting of hydrogen, deuterium, alkyl, heteroalkyl, aryl or heteroaryl groups. Most preferably, at least one of $R_x$ and $R_y$ contains a branched alkyl moiety with branching at a position further than the α position to the carbonyl group. In one aspect, at least one of $R_x$ and $R_y$ is isobutyl. In another aspect, $R_z$ is hydrogen.

In one aspect, the compound has a formula selected from the group consisting of:

Formula II

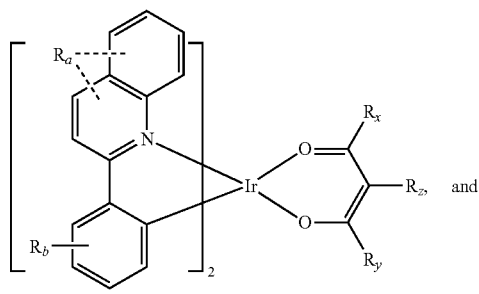

and

Formula III

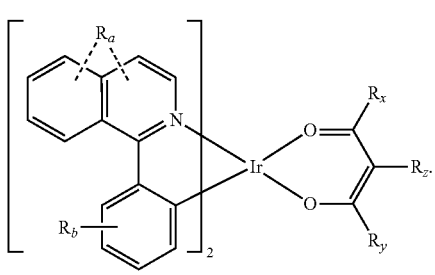

In another aspect, the (iso)pq ligand is selected from the group consisting of:

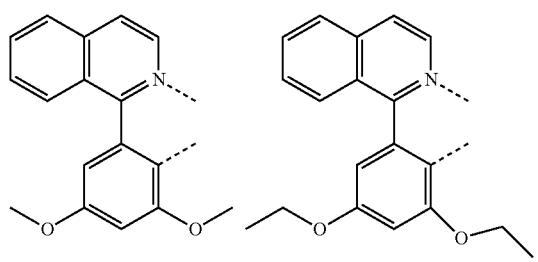

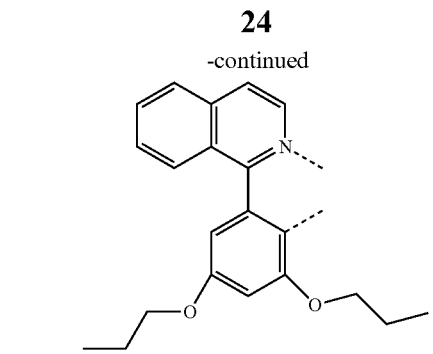

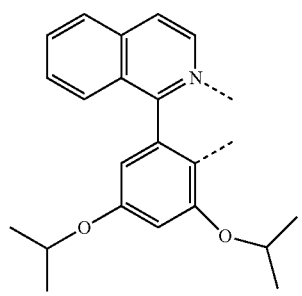

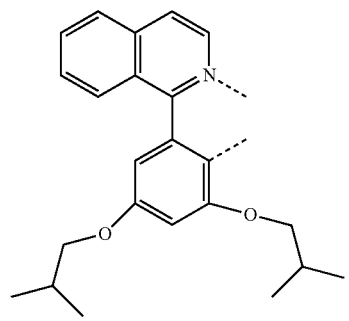

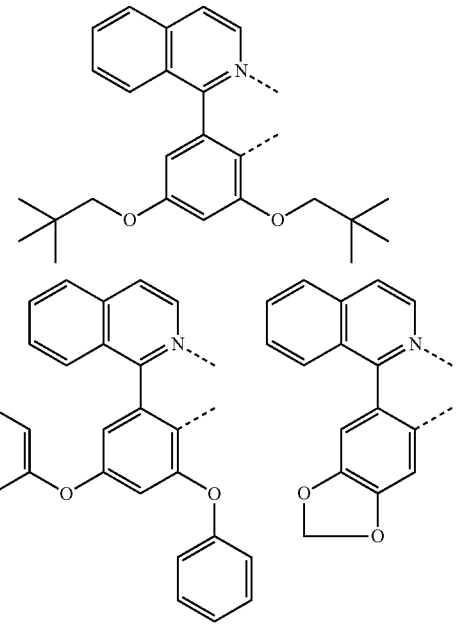

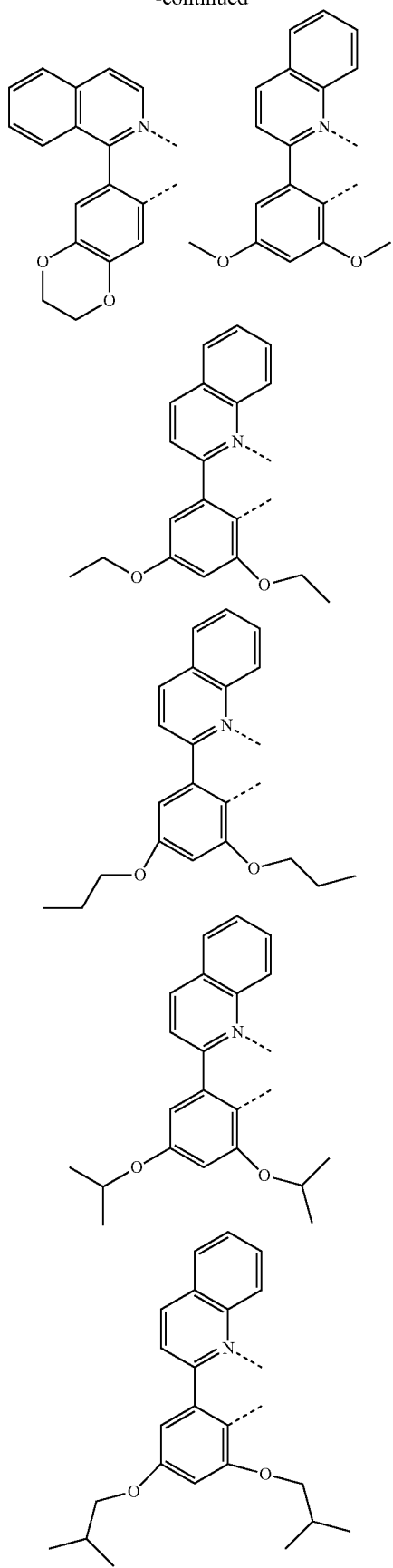
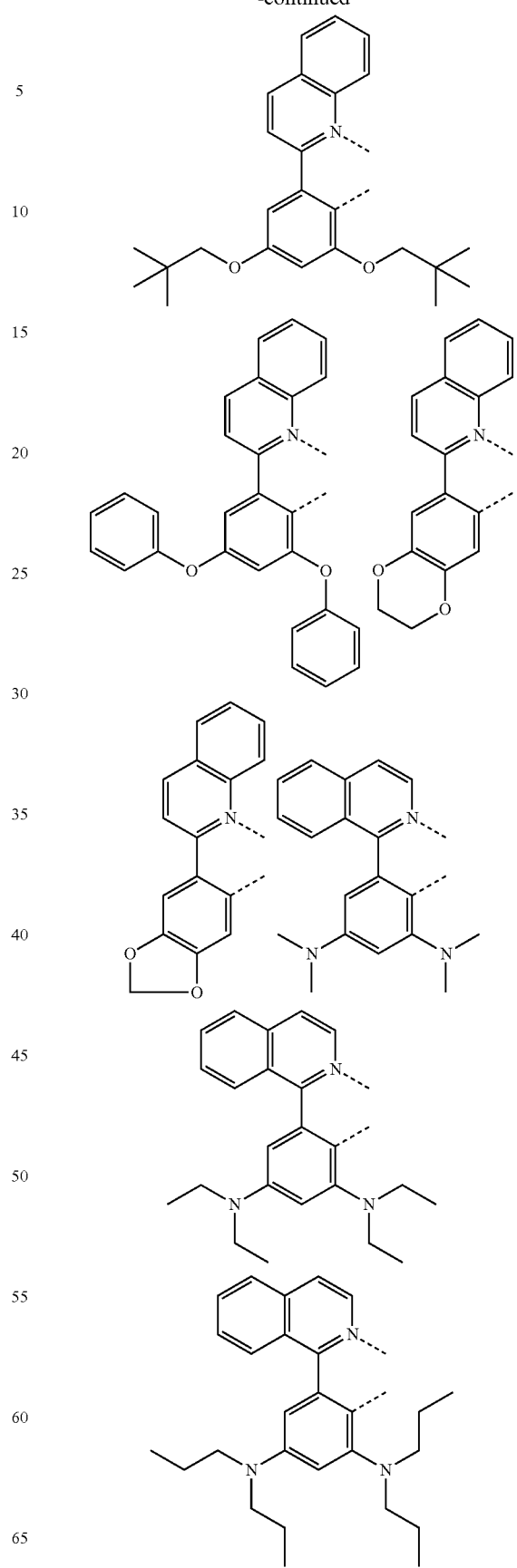

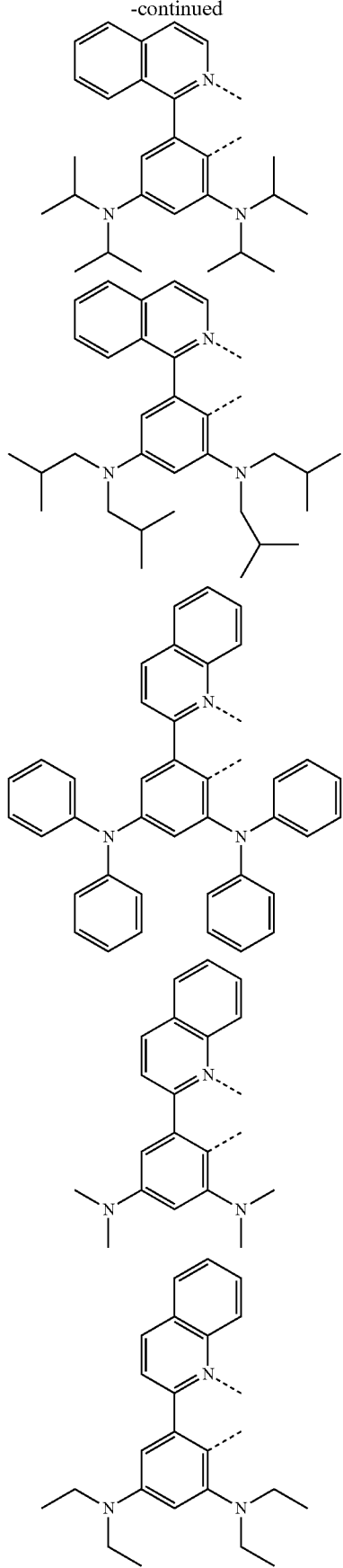
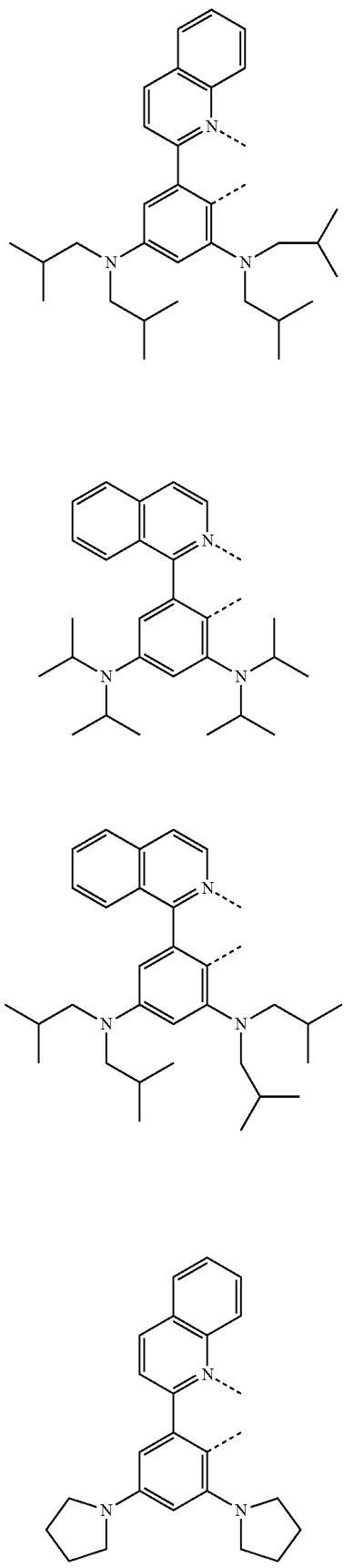

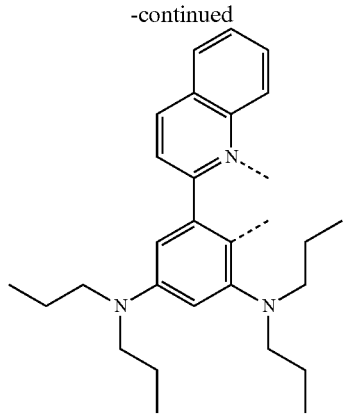

Specific examples of devices comprising inventive compounds are provided. In one aspect, the compound is selected from the group consisting of Compound 1-Compound 7.

In one aspect, the organic layer is an emissive layer and the compound having Formula I is an emitting dopant. In another aspect, the organic layer further comprises a host. Preferably, the host is a metal 8-hydroxyquinolate. More preferably, the host is:

Compound D

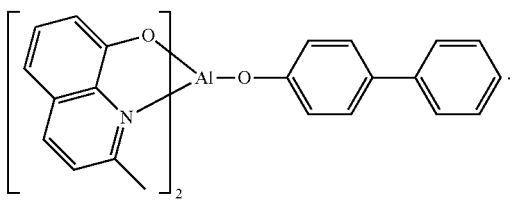

In one aspect, the first device is a consumer product. In another aspect, the first device is an organic light emitting device.

In one aspect, the device comprises a compound having an emissive spectrum having a peak wavelength of about 650 nm to about 700 nm.

In addition, there are several other embodiments; however, these embodiments are less preferred.

A compound having the formula $M(Li)_m(L'j)_n$ is provided. M is a metal having an atomic weight higher than 40. m is at least 1. n is at least 1. m+n is the oxidation state of the metal M. i is an indexing variable having a value from 1 to m. j is an indexing variable having a value from 1 to n. Each L independently has the formula:

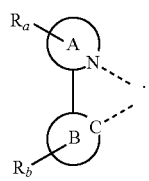

A and B are each independently a 5 or 6-membered aromatic or heteroaromatic ring. A-B represents a bonded pair of aromatic or heteroaromatic rings coordinated to the metal via a nitrogen atom on ring A and an sp² hybridized carbon atom on ring B. Each of $R_a$ and $R_b$ may represent mono, di, tri, or tetra substituents. Each $R_a$ substituent is independently selected from the group consisting of hydrogen, deuterium, alkyl, heteroalkyl, aryl, or heteroaryl groups. Each $R_b$ substituent is independently selected from a group consisting of hydrogen, deuterium, alkyl, heteroalkyl, aryl, or heteroaryl groups, and at least one $R_b$ substituent is selected from the group consisting of alkoxy, aryloxy, alkyl amino and arylamino. Each L' independently has the formula:

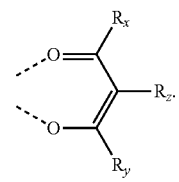

$R_x$, $R_y$, $R_z$ are each independently selected from the group consisting of hydrogen, deuterium, alkyl, heteroalkyl, aryl, or heteroaryl groups. At least one of $R_x$ and $R_y$ contains a branched alkyl moiety with branching at a position further than the α position to the carbonyl group. Preferably, at least one of $R_x$ and $R_y$ is isobutyl. Preferably, $R_z$ is hydrogen.

In one aspect, the compound has the formula:

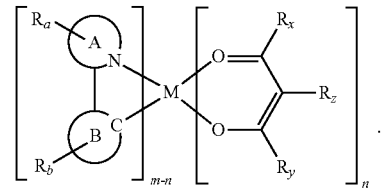

m is the oxidation state of the metal. M−n is at least 1.

In another aspect, the metal M is Ir.

In yet another aspect, the compound has a formula selected from the group consisting of:

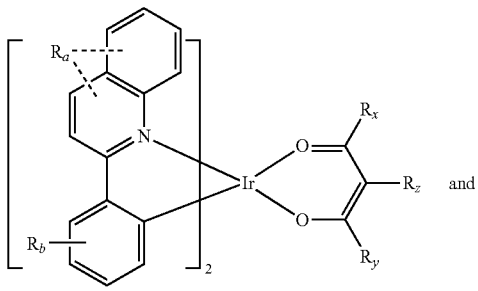 and

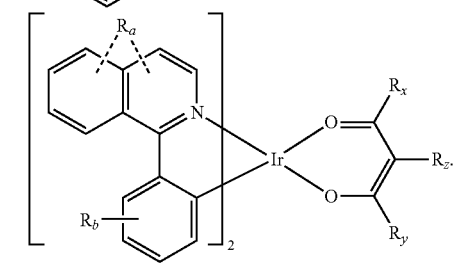

In one aspect, the bonded pair of aromatic or heteroaromatic rings represented by A-B is selected from the group consisting of:
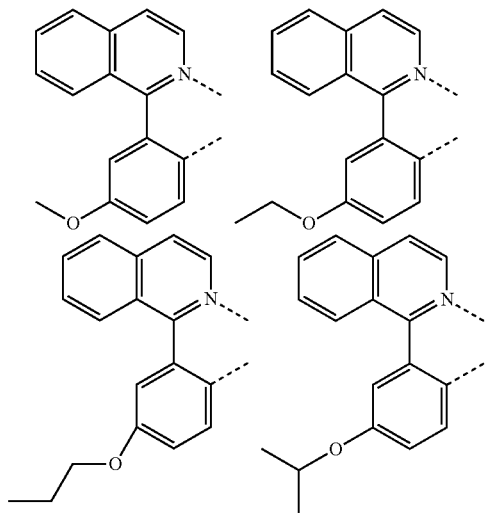
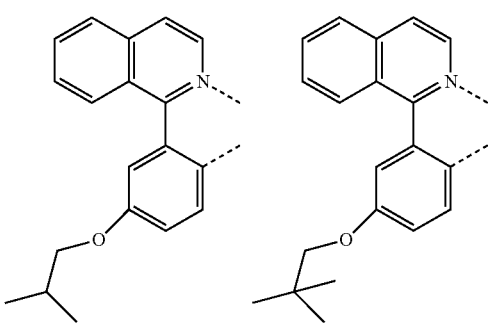
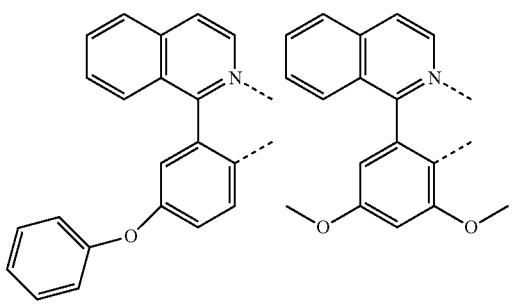
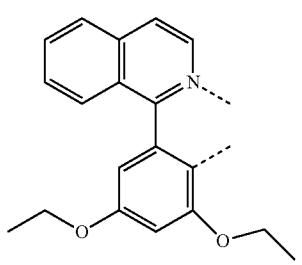
-continued
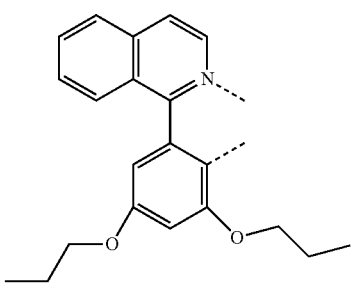
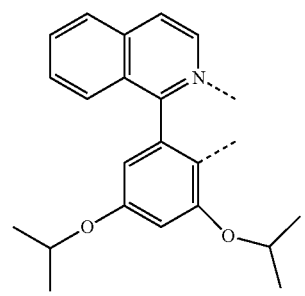
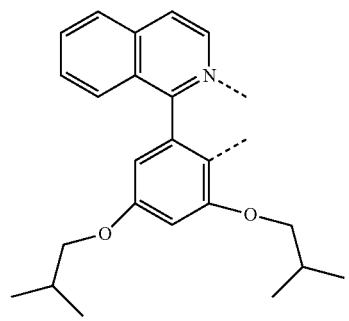
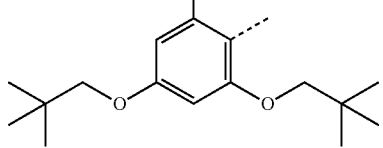
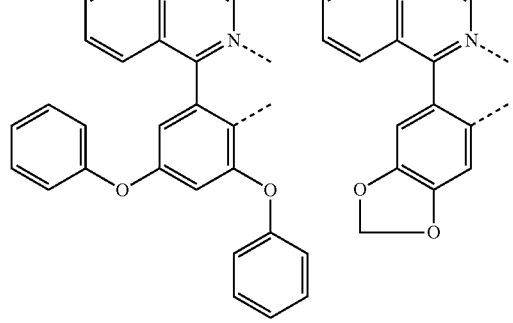

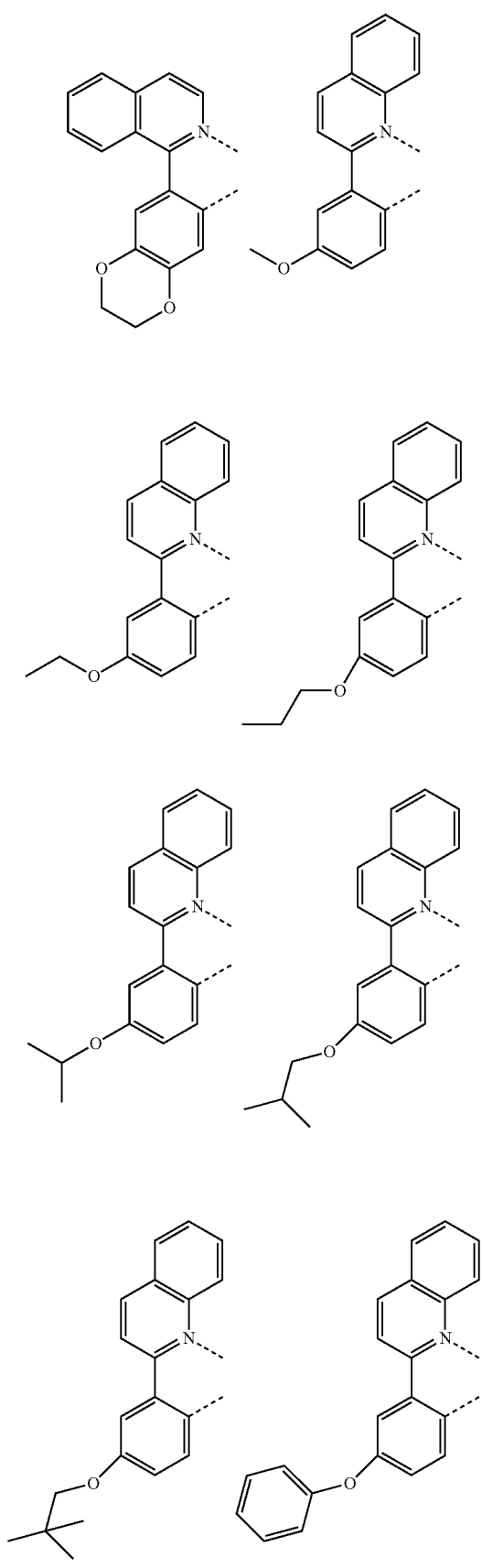
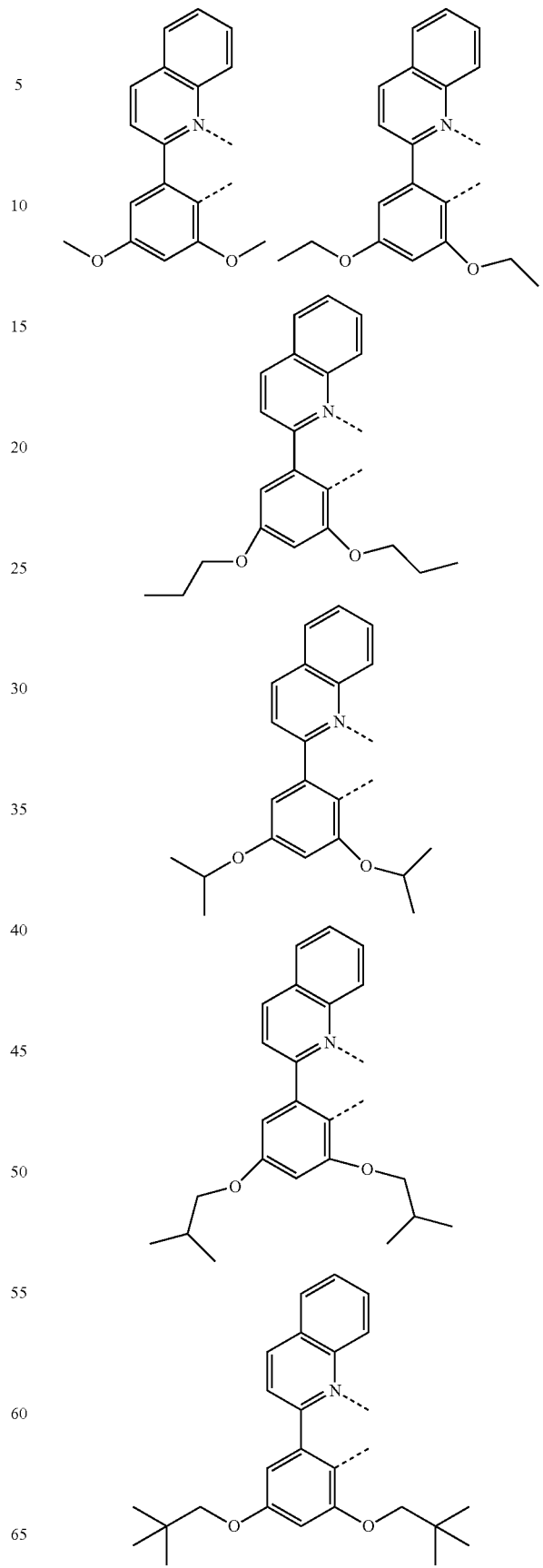

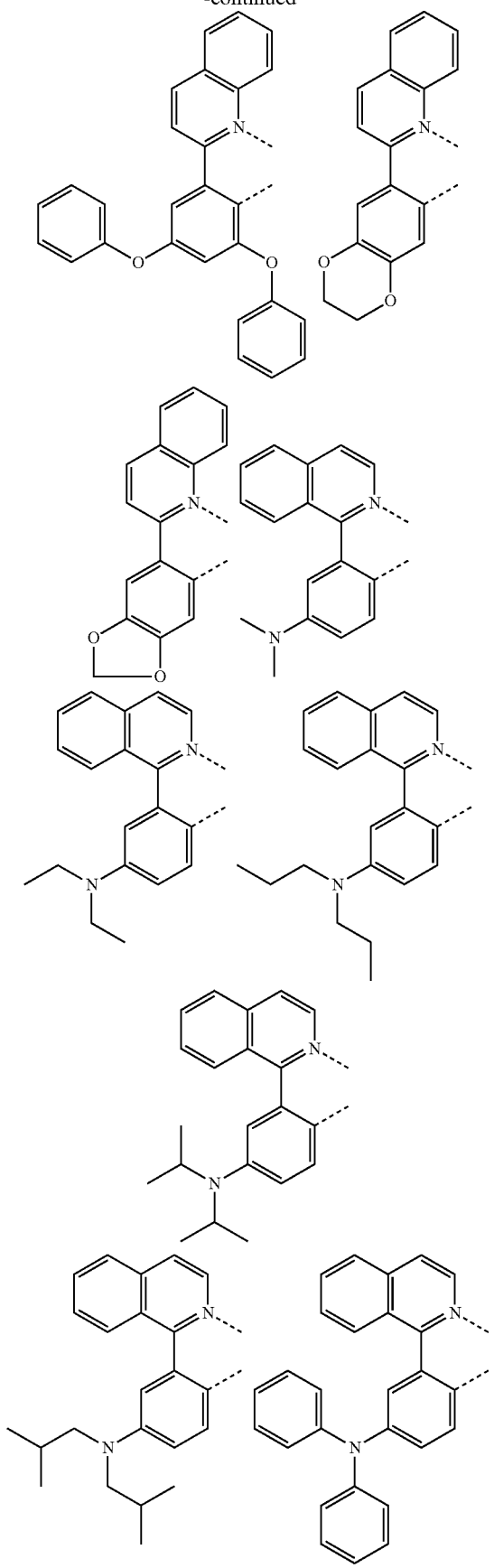
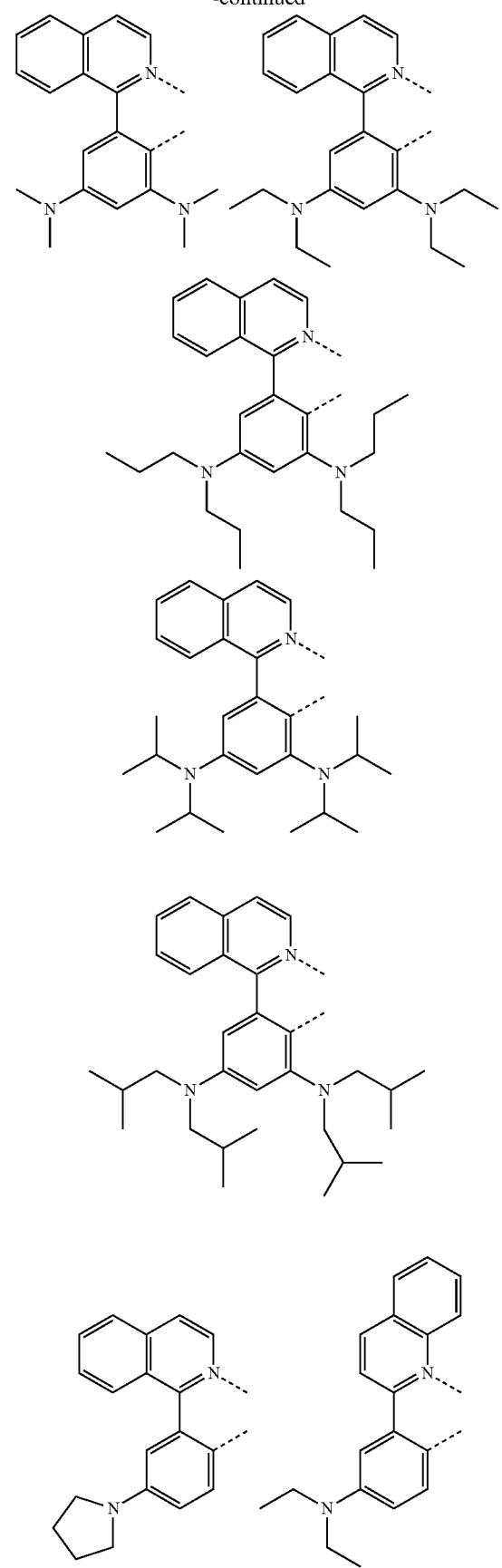

-continued
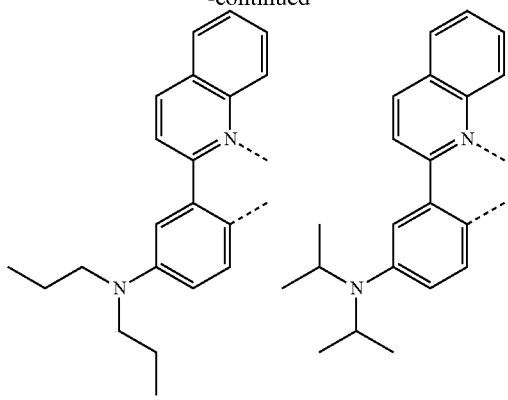
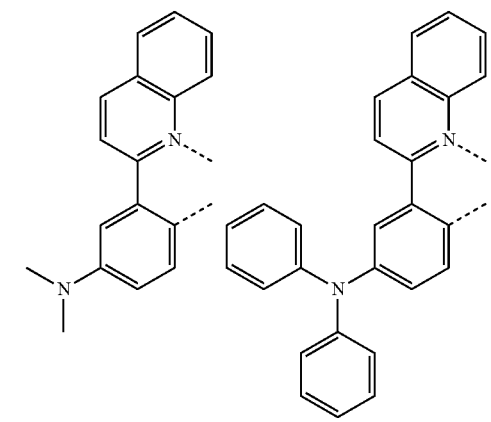
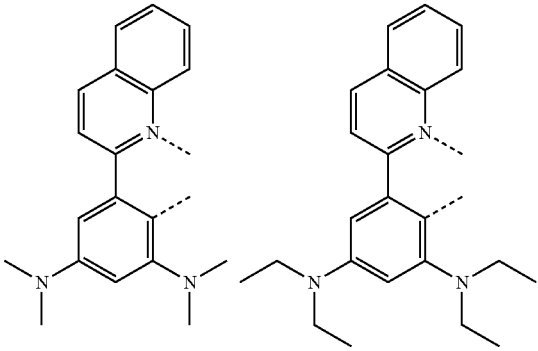
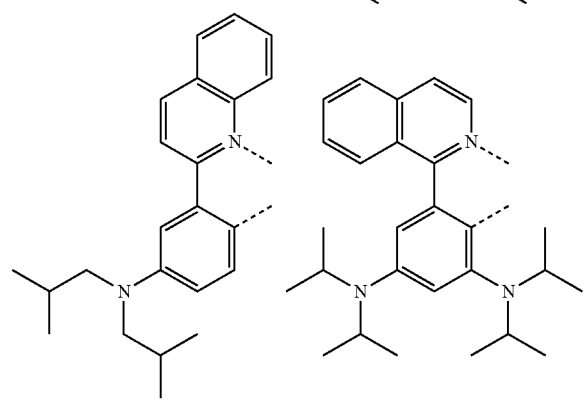
-continued
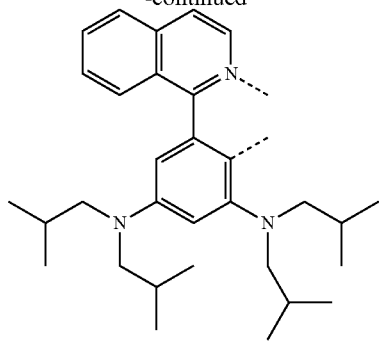
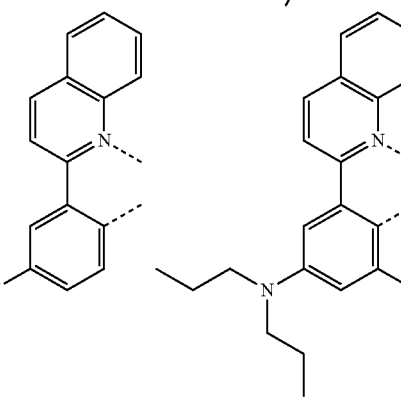
Specific non-limiting examples of such compounds include compounds selected from the group consisting of:
Compound 1
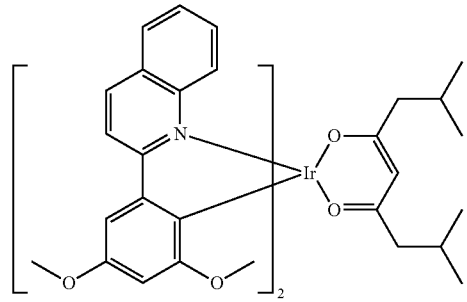
Compound 2
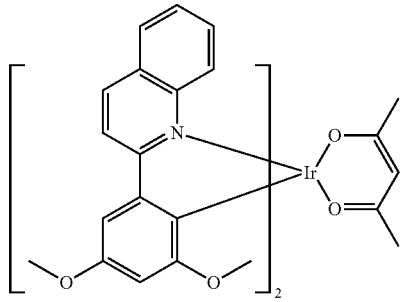

Compound 3
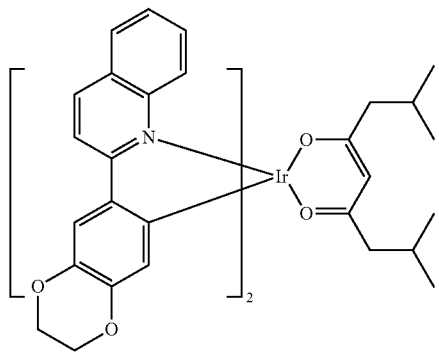

Compound 4
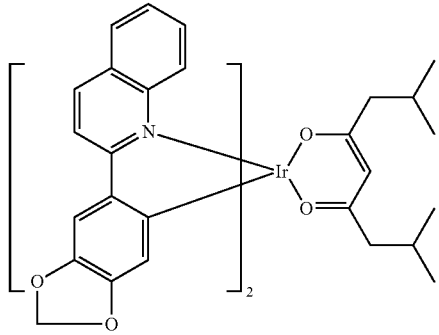

Compound 5
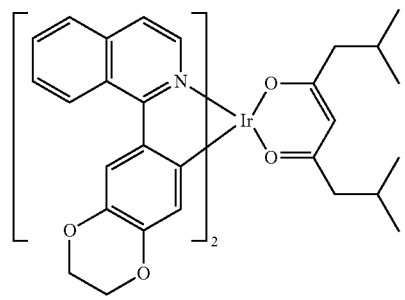

Compound 6
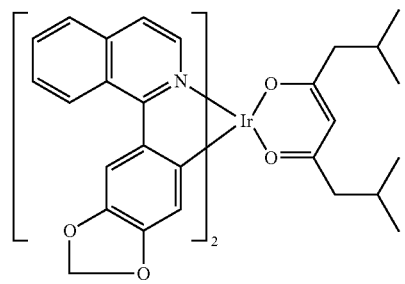

Compound 7
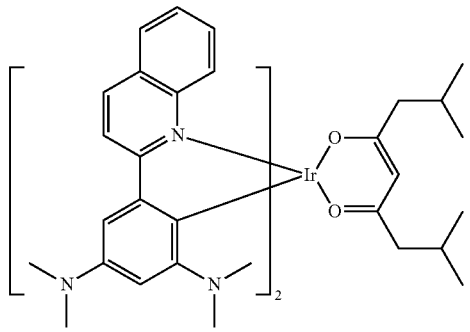

Compound 8
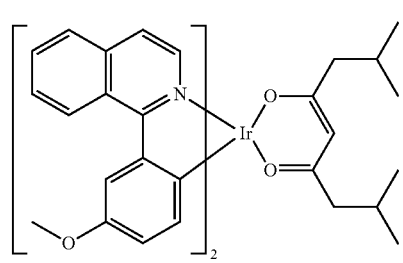

Compound 9
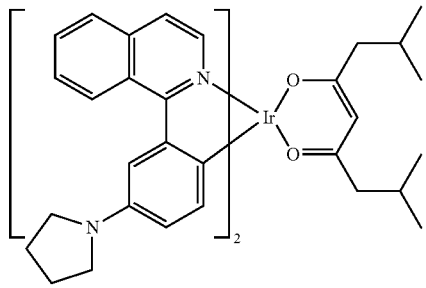

Compound 10
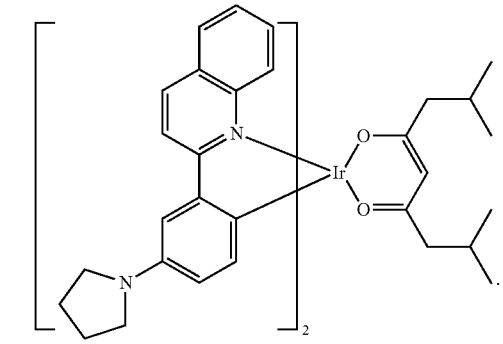

Compound 11
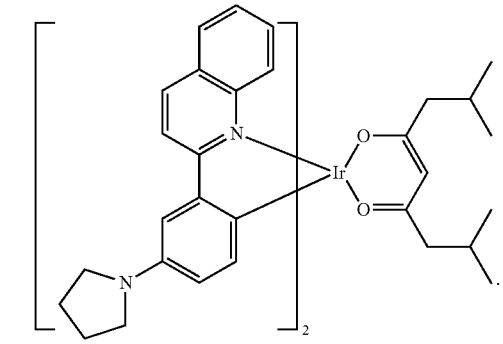

Additionally, a first device comprising an organic light emitting device is provided. The organic light emitting device comprises an anode, a cathode, and an organic layer, disposed between the anode and the cathode. The organic layer comprises a compound having the formula $M(L_i)_m(L'_j)_n$. M is a metal having an atomic weight higher than 40. Preferably, the metal M is Ir. m is at least 1. n is at least 1. m+n is the oxidation state of the metal M. i is an indexing variable having a value from 1 to m. j is an indexing variable having a value from 1 to n. Each L independently has the formula:

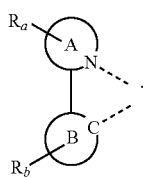

A and B are each independently a 5 or 6-membered aromatic or heteroaromatic ring. A-B represents a bonded pair of aromatic or heteroaromatic rings coordinated to the metal via a nitrogen atom on ring A and an $sp^2$ hybridized carbon atom on ring B. Each of $R_a$ and $R_b$ may represent mono, di, tri, or tetra substituents. Each $R_a$ substituent is independently selected from the group consisting of hydrogen, deuterium, alkyl, heteroalkyl, aryl, or heteroaryl groups. Each $R_b$ substituent is independently selected from a group consisting of hydrogen, deuterium, alkyl, heteroalkyl, aryl, or heteroaryl groups. At least one $R_b$ substituent is selected from the group consisting of alkoxy, aryloxy, alkyl amino and arylamino. Each L' independently has the formula:

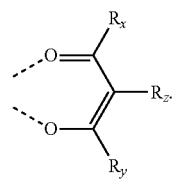

$R_x$, $R_y$, $R_z$ are each independently selected from the group consisting of hydrogen, deuterium, alkyl, heteroalkyl, aryl, or heteroaryl groups. At least one of $R_x$ and $R_y$ contains a branched alkyl moiety with branching at a position further than the α position to the carbonyl group. Preferably, at least one of $R_x$ and $R_y$ is isobutyl. Preferably, $R_z$ is hydrogen.

The various specific aspects discussed above for compounds having the formula $M(L_i)_m(L'_j)_n$ are also applicable to a compound having the formula $M(L_i)_m(L'_j)_n$ when used in the first device. In particular, specific aspects of M, $L_i$, $L'_j$, m, n, j, L, A, B, A-B, $R_a$, $R_b$, $R_x$, $R_y$, and $R_z$ discussed above for compounds having the formula $M(L_i)_m(L'_j)_n$ are also applicable to a compound having the formula $M(L_i)_m(L'_j)_n$ when used in the first device.

Specific examples of compounds for use in the first device are provided. In one aspect, the compound is selected from the group consisting of Compound 1-Compound 11.

In one aspect, the organic layer is an emissive layer and the compound having Formula I is an emitting dopant. In another aspect, the organic layer further comprises a host. Preferably, the host is a metal 8-hydroxyquinolate. More preferably, the host is:

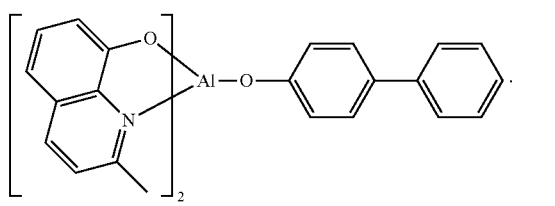

Compound D

In one aspect, the device is a consumer product. In another aspect, the device is an organic light emitting device.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in embodiments of the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and sliane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

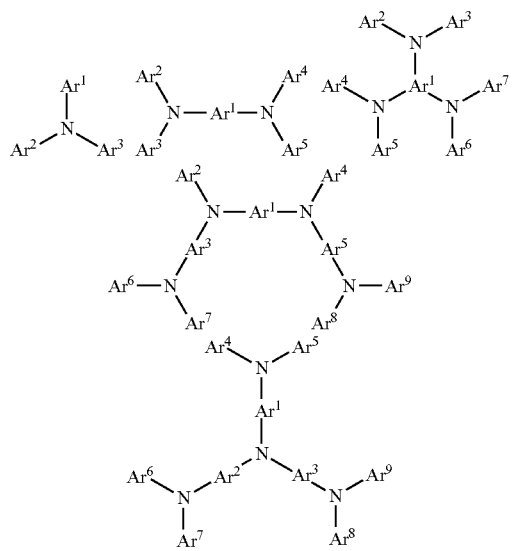

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, alkyl, alkoxy, amino, alkenyl, alkynyl, arylalkyl, heteroalkyl, aryl and heteroaryl.

In one aspect, $Ar^1$ to $Ar^9$ is independently selected from the group consisting of:

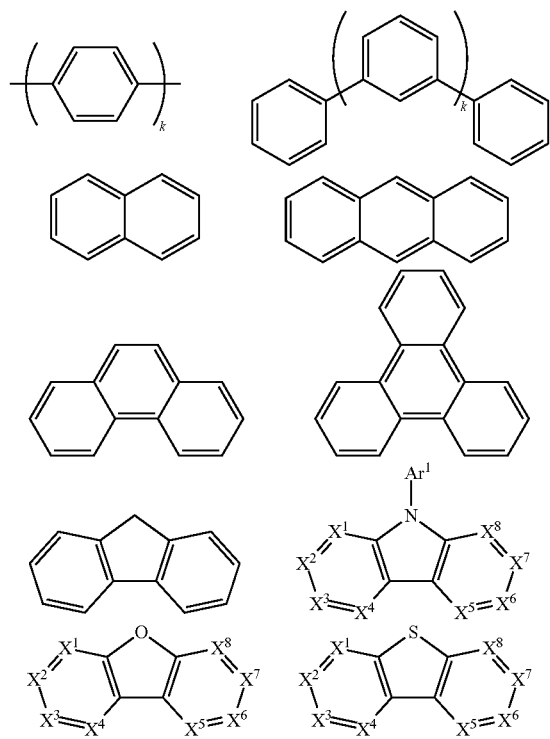

k is an integer from 1 to 20; $X^1$ to $X^8$ is CH or N; $Ar^1$ has the same group defined above.

Examples of metal complexes used in HIL or HTL include, but not limit to the following general formula:

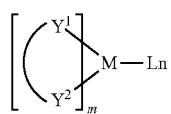

M is a metal, having an atomic weight greater than 40; $(Y^1—Y^2)$ is a bidentate ligand, Y1 and $Y^2$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, $(Y^1—Y^2)$ is a 2-phenylpyridine derivative.

In another aspect, $(Y^1—Y^2)$ is a carbene ligand.

In another aspect, M is selected from Ir, Pt, Os, and Zn.

In a further aspect, the metal complex has a smallest oxidation potential in solution vs. $Fc^+/Fc$ couple less than about 0.6 V.

Host:

The light emitting layer of the organic EL device in embodiments of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant.

Examples of metal complexes used as host are preferred to have the following general formula:

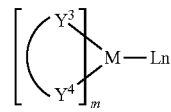

M is a metal; $(Y^3—Y^4)$ is a bidentate ligand, $Y^3$ and $Y^4$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, the metal complexes are:

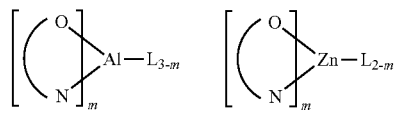

(O—N) is a bidentate ligand, having metal coordinated to atoms O and N.

In another aspect, M is selected from Ir and Pt.

In a further aspect, $(Y^3—Y^4)$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, alkyl, alkoxy, amino, alkenyl, alkynyl, arylalkyl, heteroalkyl, aryl and heteroaryl.

In one aspect, the host compound contains at least one of the following groups in the molecule:

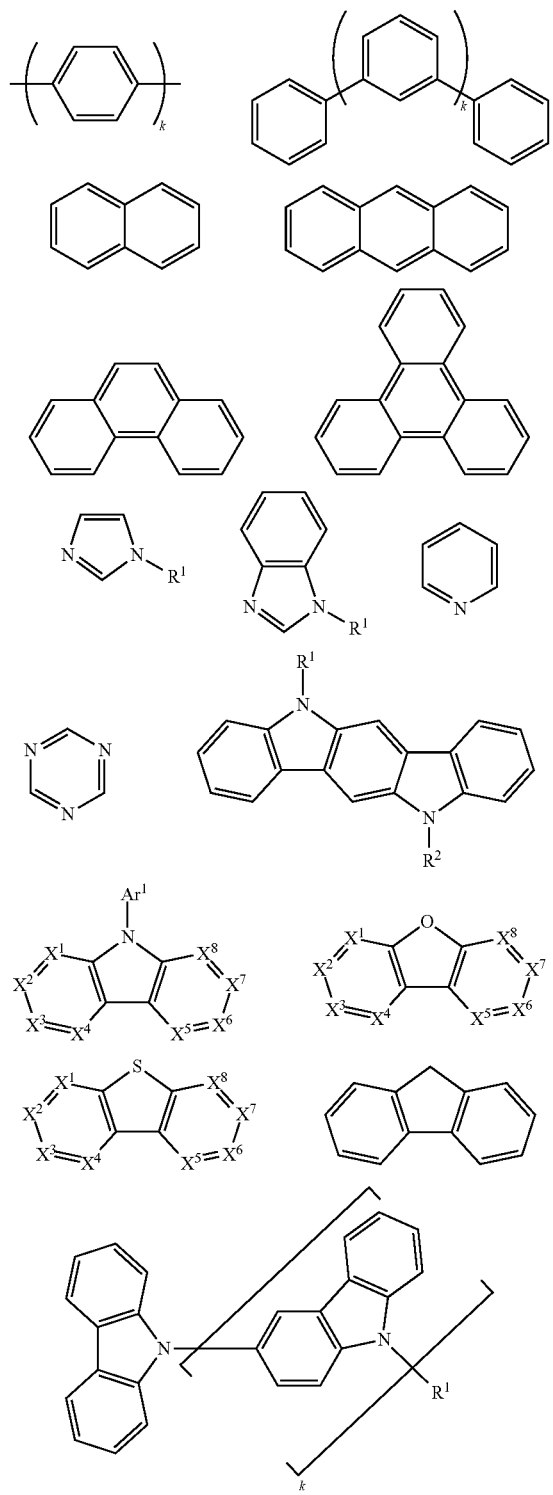

-continued

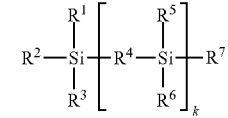 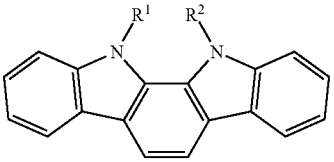

$R^1$ to $R^7$ are independently selected from the group consisting of hydrogen, deuterium, alkyl, alkoxy, amino, alkenyl, alkynyl, arylalkyl, heteroalkyl, aryl and heteroaryl, when it is aryl or heteroaryl, it has the similar definition as Ar's mentioned above.

k is an integer from 0 to 20.

$X^1$ to $X^8$ is selected from CH or N.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule used as host described above.

In another aspect, compound used in HBL contains at least one of the following groups in the molecule:

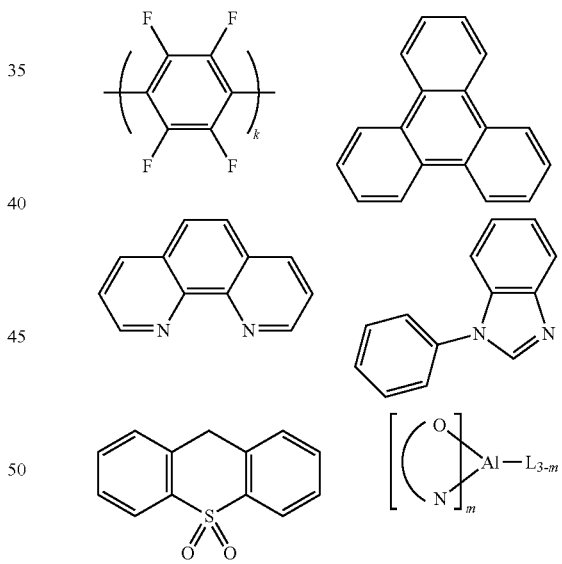

k is an integer from 0 to 20; L is an ancillary ligand, m is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

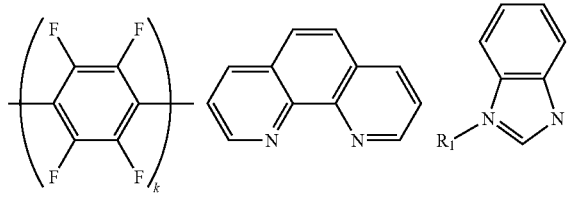

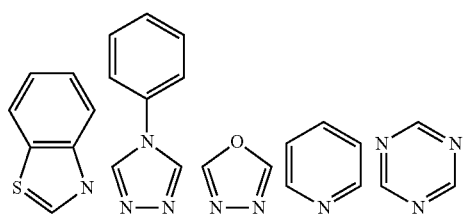

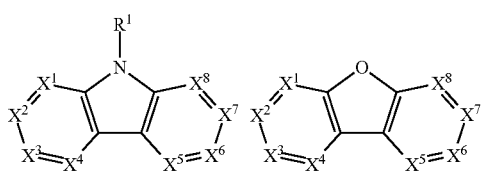

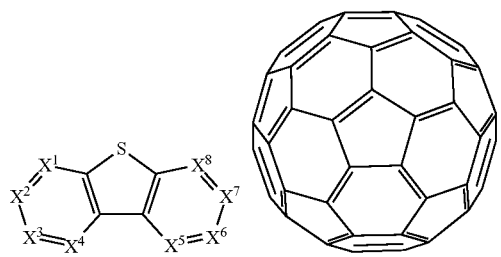

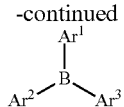

$R^1$ is selected from the group consisting of hydrogen, deuterium, alkyl, alkoxy, amino, alkenyl, alkynyl, arylalkyl, heteroalkyl, aryl and heteroaryl, when it is aryl or heteroaryl, it has the similar definition as Ar's mentioned above.

$Ar^1$ to $Ar^3$ has the similar definition as Ar's mentioned above.

k is an integer from 0 to 20.

$X^1$ to $X^8$ is selected from CH or N.

In another aspect, the metal complexes used in ETL contains, but not limit to the following general formula:

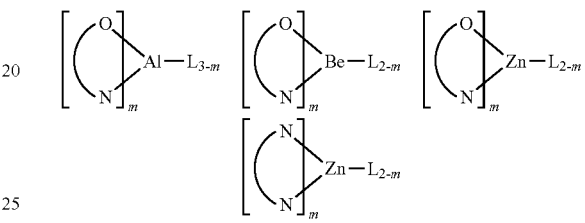

(O—N) or (N—N) is a bidentate ligand, having metal coordinated to atoms O, N or N, N; L is an ancillary ligand; m is an integer value from 1 to the maximum number of ligands that may be attached to the metal.

In any above-mentioned compounds used in each layer of OLED device, the hydrogen atoms can be partially or fully deuterated.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 1 below. Table 1 lists non-limiting classes of materials, non-limiting examples of compounds for each class, and references that disclose the materials.

TABLE 1

| MATERIAL | EXAMPLES OF MATERIAL | PUBLICATIONS |
|---|---|---|
| Hole injection materials | | |
| Phthalocyanine and porphryin compounds | | Appl. Phys. Lett. 69, 2160 (1996) |

TABLE 1-continued

| MATERIAL | EXAMPLES OF MATERIAL | PUBLICATIONS |
|---|---|---|
| Starburst triarylamines | | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT:PSS, polyaniline, polypthiophene) | | Synth. Met. 87, 171 (1997) WO2007002683 |
| Phosphonic acid and sliane SAMs | | US20030162053 |
| Triarylamine or polythiophene polymers with conductivity dopants | | EA01725079A1 | and

TABLE 1-continued
| MATERIAL | EXAMPLES OF MATERIAL | PUBLICATIONS |
|---|---|---|
| | 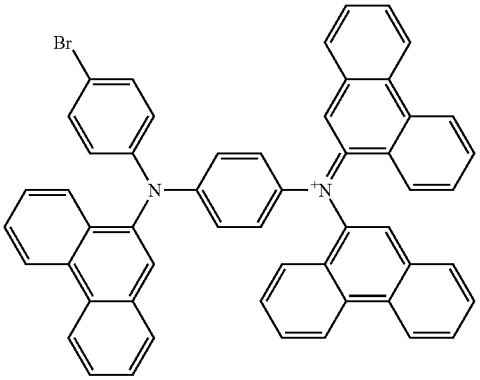 | |
| | 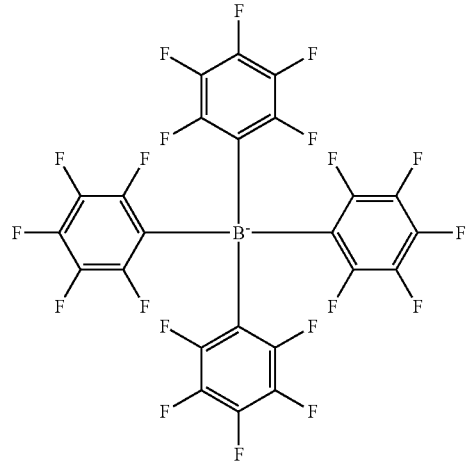 | |
| Arylamines complexed with metal oxides such as molybdenum and tungsten oxides | 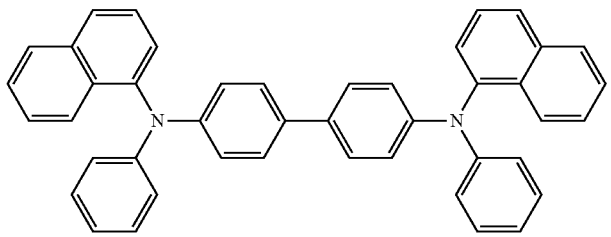 + MoO$_x$ | SID Symposium Digest, 37, 923 (2006) WO2009018009 |
| p-type semiconducting organic complexes | 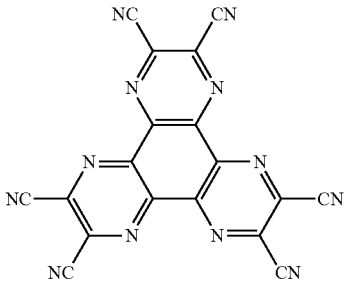 | US20020158242 |

TABLE 1-continued

| MATERIAL | EXAMPLES OF MATERIAL | PUBLICATIONS |
| --- | --- | --- |
| Metal organometallic complexes | | US20060240279 |
| Cross-linkable compounds | | US20080220265 |

Hole transporting materials

| | | |
| --- | --- | --- |
| Triarylamines (e.g., TPD, α-NPD) | | Appl. Phys. Lett. 51, 913 (1987) |
| | | U.S. Pat. No. 5,061,569 |

TABLE 1-continued
| MATERIAL | EXAMPLES OF MATERIAL | PUBLICATIONS |
|---|---|---|
| | 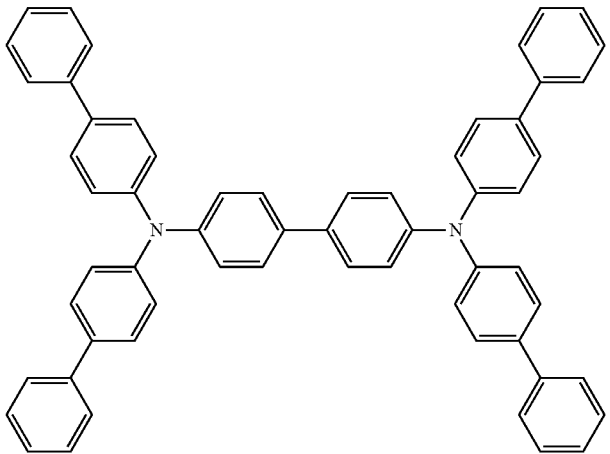 | EP650955 |
| | 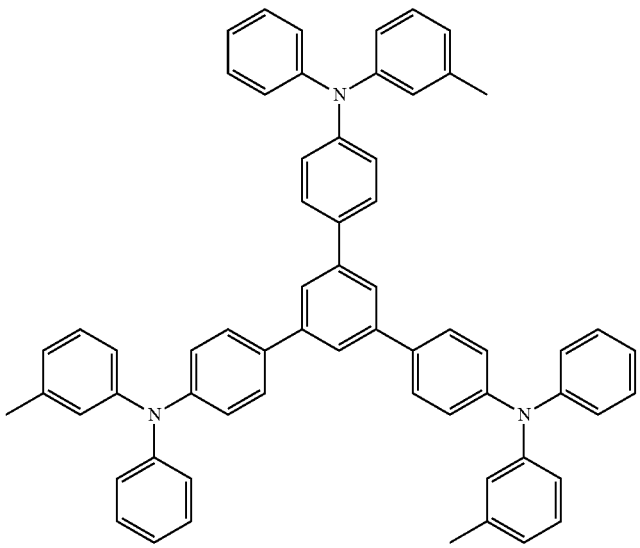 | J. Mater. Chem. 3, 319 (1993) |
| | 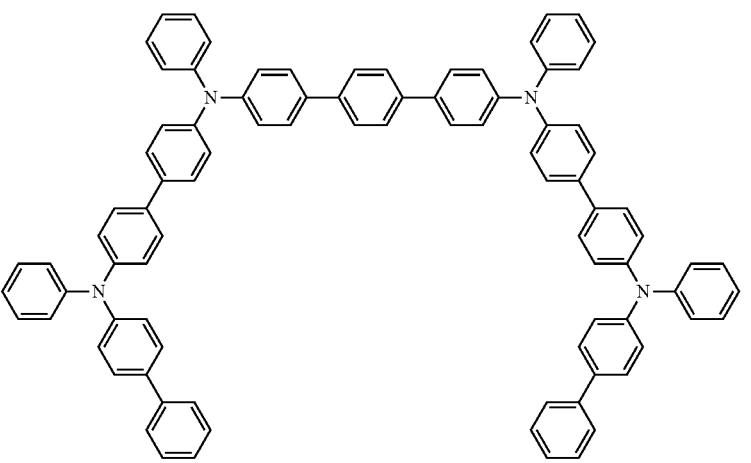 | Appl. Phys. Lett. 90, 183503 (2007) |

TABLE 1-continued

| MATERIAL | EXAMPLES OF MATERIAL | PUBLICATIONS |
| --- | --- | --- |
| | | Appl. Phys. Lett. 90, 183503 (2007) |
| Triaylamine on spirofluorene core | | Synth. Met. 91, 209 (1997) |
| Arylamine carbazole compounds | | Adv. Mater. 6, 677 (1994), US20080124572 |
| Triarylamine with (di)benzothiophene/ (di)benzofuran | | US20070278938, US20080106190 |

TABLE 1-continued

| MATERIAL | EXAMPLES OF MATERIAL | PUBLICATIONS |
| --- | --- | --- |
| Indolocarbazoles | | Synth. Met. 111, 421 (2000) |
| Isoindole compounds | | Chem. Mater. 15, 3148 (2003) |
| Metal carbene complexes | | US20080018221 |

Phosphorescent OLED host materials
Red hosts

| Arylcarbazoles | | Appl. Phys. Lett. 78, 1622 (2001) |
| --- | --- | --- |

TABLE 1-continued

| MATERIAL | EXAMPLES OF MATERIAL | PUBLICATIONS |
|---|---|---|
| Metal 8-hydroxyquinolates (e.g., Alq$_3$, BAlq) | | Nature 395, 151 (1998) |
| | | US20060202194 |
| | | WO2005014551 |
| | | WO2006072002 |
| Metal phenoxybenzothiazole compounds | | Appl. Phys. Lett. 90, 123509 (2007) |
| Conjugated oligomers and polymers (e.g., polyfluorene) | | Org. Electron. 1, 15 (2000) |
| Aromatic fused rings | | WO2009066779, WO2009066778, WO2009063833, US20090045731, US20090045730, WO2009008311, US20090008605, US20090009065 |

TABLE 1-continued
| MATERIAL | EXAMPLES OF MATERIAL | PUBLICATIONS |
| --- | --- | --- |
| Zinc complexes | 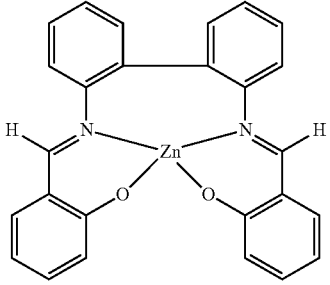 | WO2009062578 |
| Green hosts | | |
| Arylcarbazoles | 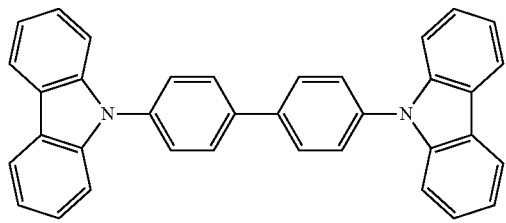 | Appl. Phys. Lett. 78, 1622 (2001) |
|  | 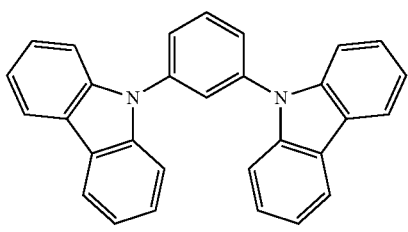 | US20030175553 |
|  | 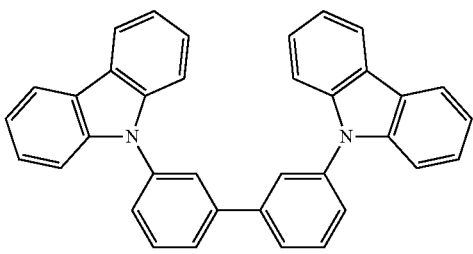 | WO2001039234 |
| Aryltriphenylene compounds | 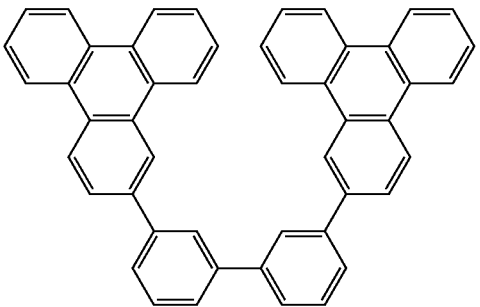 | US20060280965 |

TABLE 1-continued
| MATERIAL | EXAMPLES OF MATERIAL | PUBLICATIONS |
|---|---|---|
| | 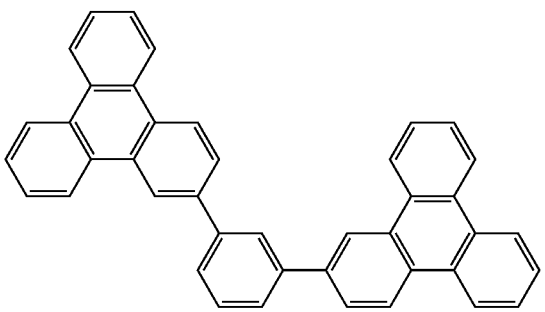 | US20060280965 |
| | 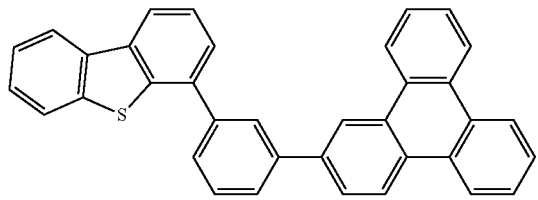 | WO2009021126 |
| Donor acceptor type molecules | 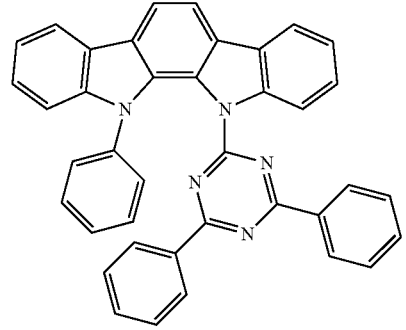 | WO2008056746 |
| Aza-carbazole/DBT/DBF | 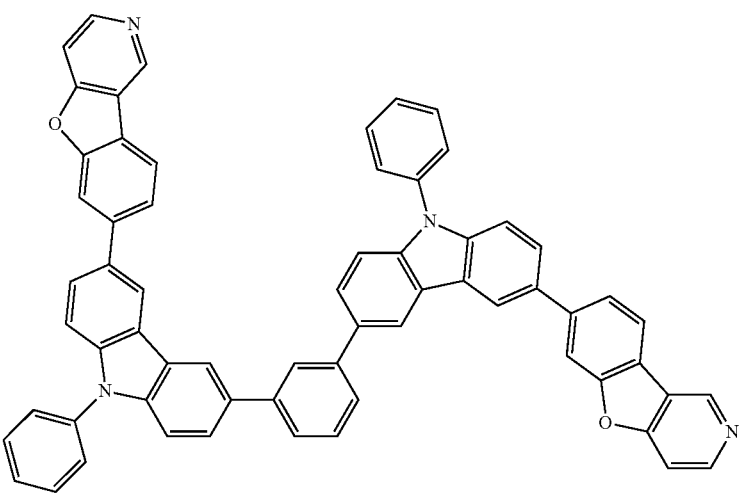 | JP208074939 |
| Polymers (e.g., PVK) | 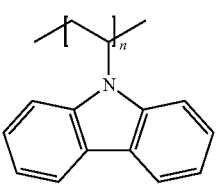 | Appl. Phys. Lett. 77, 2280 (2000) |

TABLE 1-continued

| MATERIAL | EXAMPLES OF MATERIAL | PUBLICATIONS |
| --- | --- | --- |
| Spirofluorene compounds | | WO2004093207 |
| Metal phenoxybenzooxazole compounds | | WO2005089025 |
| | | WO2006132173 |
| | | JP200511610 |
| Spirofluorene-carbazole compounds | | JP2007254297 |

TABLE 1-continued
| MATERIAL | EXAMPLES OF MATERIAL | PUBLICATIONS |
|---|---|---|
| | 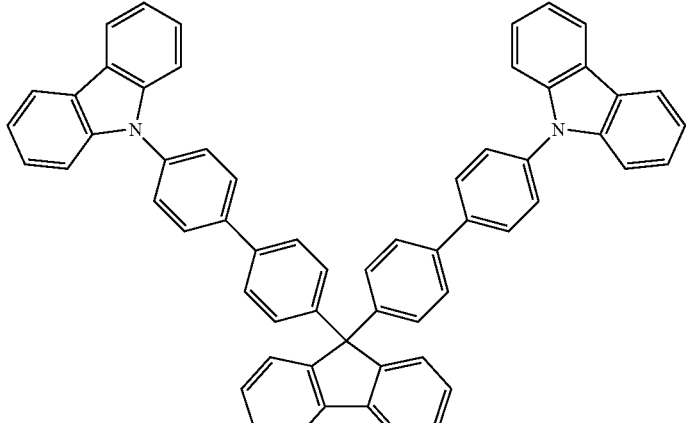 | JP2007254297 |
| Indolocabazoles | 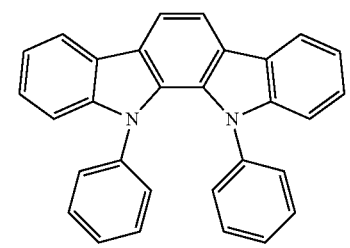 | WO2007063796 |
| | 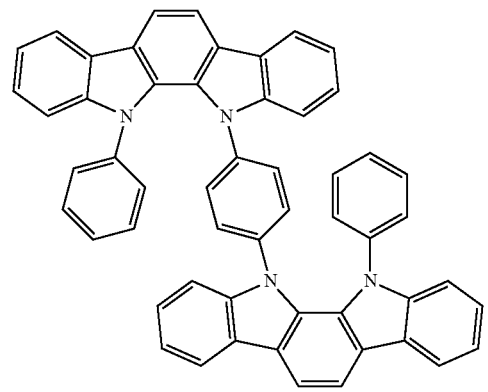 | WO2007063754 |
| 5-member ring electron deficient heterocycles (e.g., triazole, oxadiazole) | 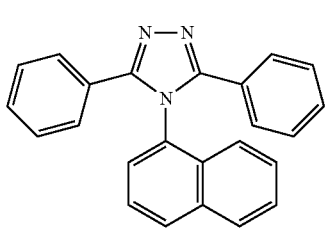 | J. Appl. Phys. 90, 5048 (2001) |
| | 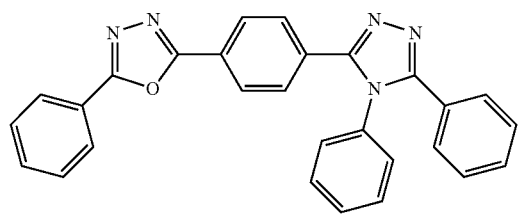 | WO2004107822 |

TABLE 1-continued
| MATERIAL | EXAMPLES OF MATERIAL | PUBLICATIONS |
|---|---|---|
| Tetraphenylene complexes | 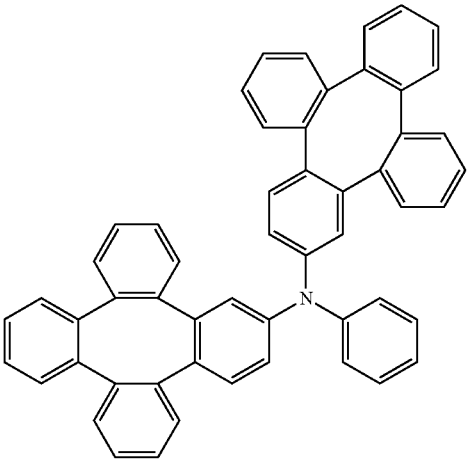 | US20050112407 |
| Metal phenoxypyridine compounds | 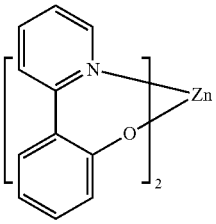 | WO2005030900 |
| Metal coordination complexes (e.g., Zn, Al with N^N ligands) | 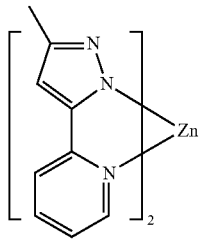 | US20040137268, US20040137267 |
Blue hosts
| | | |
|---|---|---|
| Arylcarbazoles | 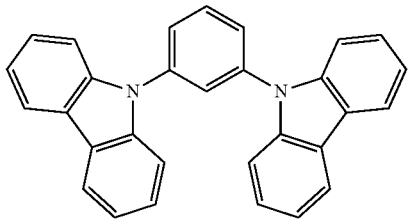 | Appl. Phys. Lett. 82, 2422 (2003) |
| | 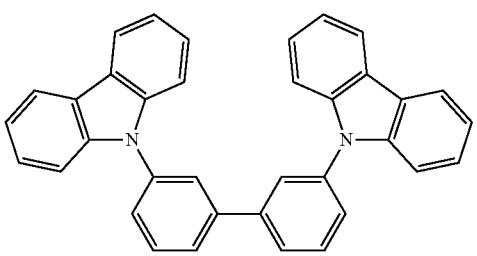 | US20070190359 |

TABLE 1-continued
| MATERIAL | EXAMPLES OF MATERIAL | PUBLICATIONS |
|---|---|---|
| Dibenzothiophene/ Dibenzofuran-carbazole compounds | 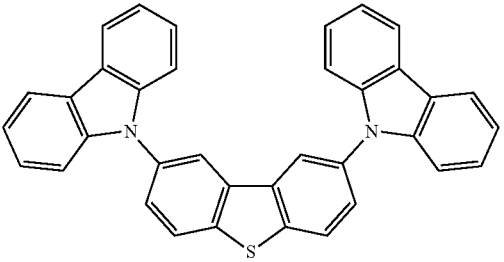 | WO2006114966, US20090167162 |
| | 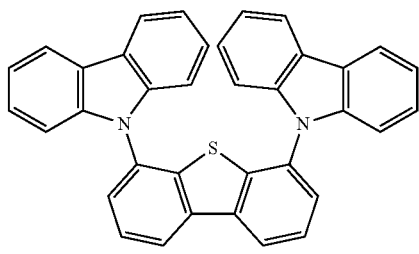 | US20090167162 |
| | 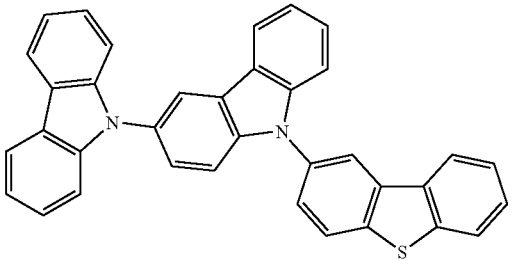 | WO2009086028 |
| | 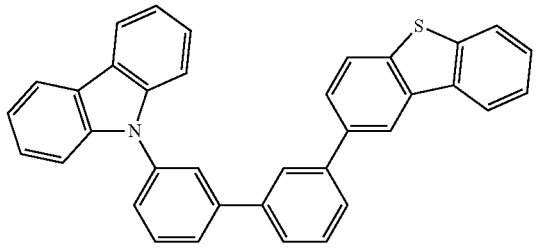 | US20090030202, US20090017330 |
| Silicon aryl compounds | 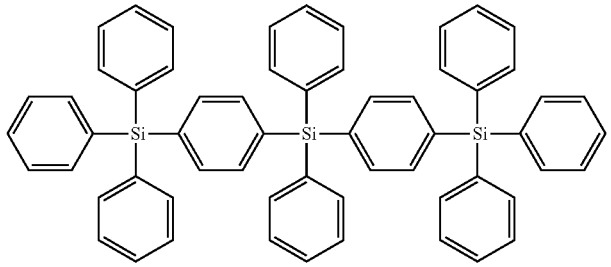 | US20050238919 |
| | 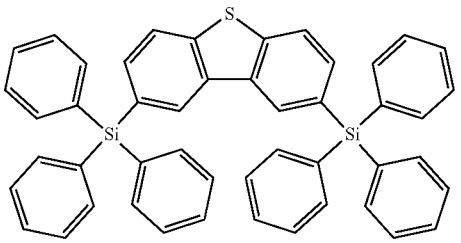 | WO2009003898 |

TABLE 1-continued

| MATERIAL | EXAMPLES OF MATERIAL | PUBLICATIONS |
| --- | --- | --- |
| Silicon/Germanium aryl compounds | | EP2034538A |
| Aryl benzoyl ester | | WO2006100298 |
| High triplet metal organometallic complex | | U.S. Pat. No. 7,154,114 |

Phosphorescent dopants
Red dopants

| | | |
| --- | --- | --- |
| Heavy metal porphyrins (e.g., PtOEP) | | Nature 395, 151 (1998) |
| Iridium(III) organometallic complexes | | Appl. Phys. Lett. 78, 1622 (2001) |

TABLE 1-continued

| MATERIAL | EXAMPLES OF MATERIAL | PUBLICATIONS |
|---|---|---|
| | | US2006835469 |
| | | US2006835469 |
| | | US20060202194 |
| | | US20060202194 |
| | | US20070087321 |

TABLE 1-continued

| MATERIAL | EXAMPLES OF MATERIAL | PUBLICATIONS |
|---|---|---|
| | | US20070087321 |
| | | Adv. Mater. 19, 739 (2007) |
| | | WO2009100991 |
| | | WO2008101842 |
| Platinum(II) organometallic complexes | | WO2003040257 |

TABLE 1-continued

| MATERIAL | EXAMPLES OF MATERIAL | PUBLICATIONS |
| --- | --- | --- |
| Osminum(III) complexes | [pyrazole-pyridine with CF$_3$ substituent]$_2$Os(PPhMe$_2$)$_2$ | Chem. Mater. 17, 3532 (2005) |
| Ruthenium(II) complexes | [pyrazole-isoquinoline with $^t$Bu substituent]$_2$Ru(PPhMe$_2$)$_2$ | Adv. Mater. 17, 1059 (2005) |
| Rhenium (I), (II), and (III) complexes | (8-hydroxyquinoline)Re(CO)$_4$ | US20050244673 |

Green dopants

| MATERIAL | EXAMPLES OF MATERIAL | PUBLICATIONS |
| --- | --- | --- |
| Iridium(III) organometallic complexes | Ir(ppy)$_3$ and its derivatives | Inorg. Chem. 40, 1704 (2001) |
| | Ir(ppy)$_2$(acac) | US20020034656 |

TABLE 1-continued
| MATERIAL | EXAMPLES OF MATERIAL | PUBLICATIONS |
|---|---|---|
| | 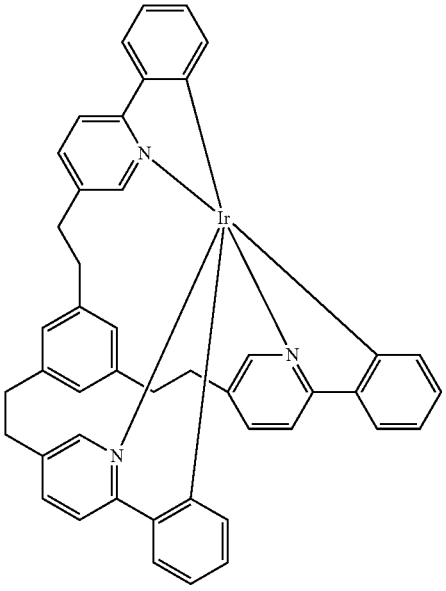 | U.S. Pat. No. 7,332,232 |
| | 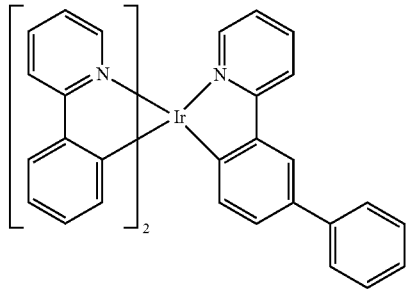 | US20090108737 |
| | 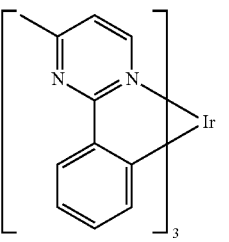 | US20090039776 |
| | 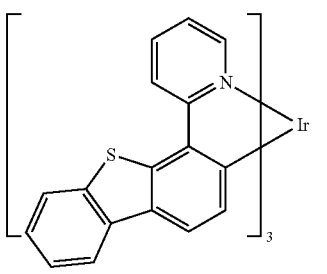 | U.S. Pat. No. 6,921,915 |

TABLE 1-continued
| MATERIAL | EXAMPLES OF MATERIAL | PUBLICATIONS |
|---|---|---|
| | 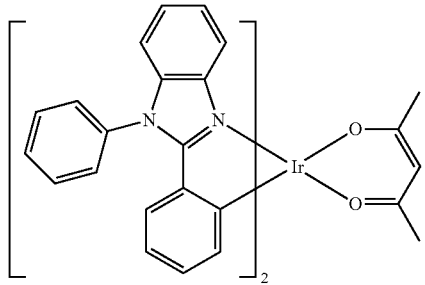 | U.S. Pat. No. 6,687,266 |
| | 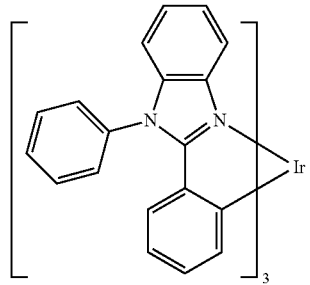 | Chem. Mater. 16, 2480 (2004) |
| | 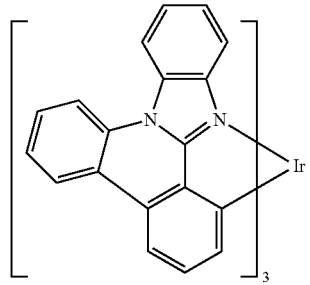 | US20070190359 |
| | 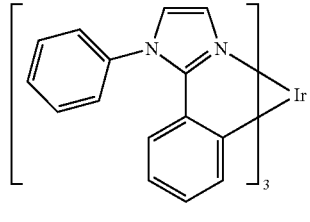 | US 20060008670 JP2007123392 |
| | 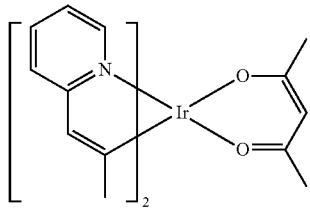 | Adv. Mater. 16, 2003 (2004) |

TABLE 1-continued
| MATERIAL | EXAMPLES OF MATERIAL | PUBLICATIONS |
|---|---|---|
| | 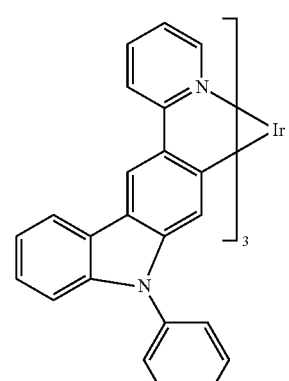 | Angew. Chem. Int. Ed. 2006, 45, 7800 |
| | 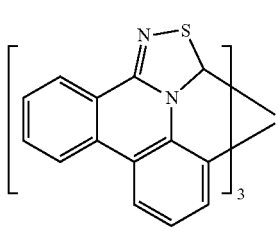 | WO2009050290 |
| | 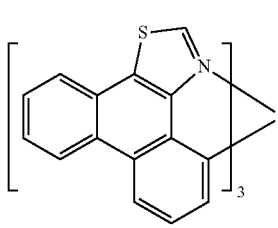 | US20090165846 |
| | 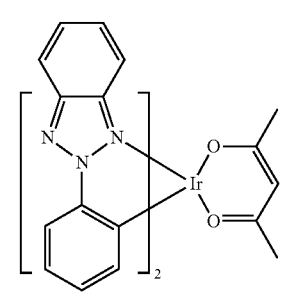 | US20080015355 |
| Monomer for polymeric metal organometallic compounds | 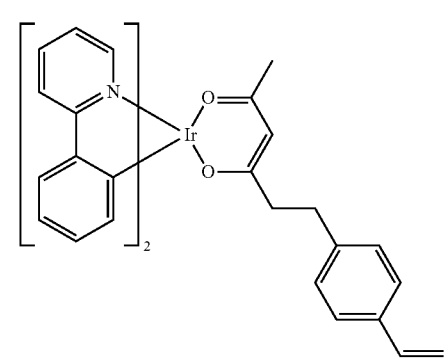 | U.S. Pat. No. 7,250,226, U.S. Pat. No. 7,396,598 |

TABLE 1-continued
| MATERIAL | EXAMPLES OF MATERIAL | PUBLICATIONS |
|---|---|---|
| Pt(II) organometallic complexes, including polydentated ligands | 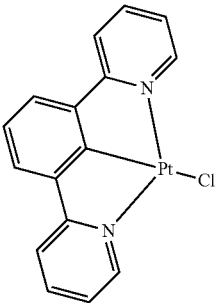 | Appl. Phys. Lett. 86, 153505 (2005) |
| | 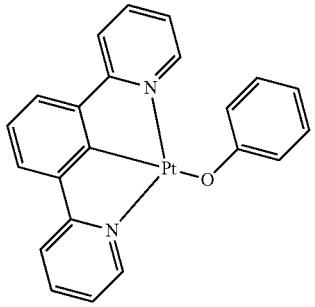 | Appl. Phys. Lett. 86, 153505 (2005) |
| | 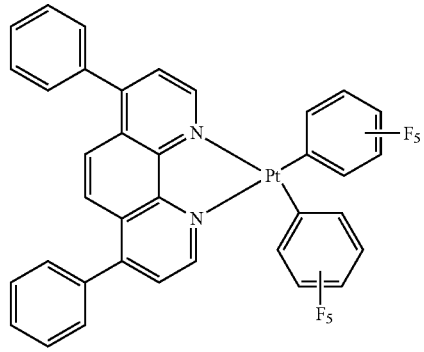 | Chem. Lett. 34, 592 (2005) |
| | 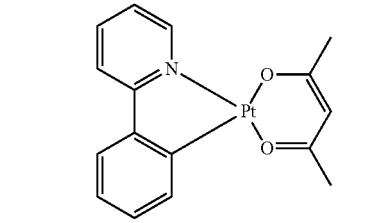 | WO2002015645 |
| | 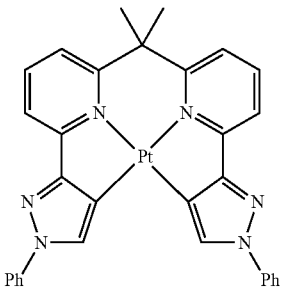 | US20060263635 |

TABLE 1-continued

| MATERIAL | EXAMPLES OF MATERIAL | PUBLICATIONS |
| --- | --- | --- |
| Cu complexes | | WO2009000673 |
| Gold complexes | | Chem. Commun. 2906 (2005) |
| Rhenium(III) complexes | | Inorg. Chem. 42, 1248 (2003) |
| Deuterated organometallic complexes | | US20030138657 |

TABLE 1-continued

| MATERIAL | EXAMPLES OF MATERIAL | PUBLICATIONS |
| --- | --- | --- |
| Organometallic complexes with two or more metal centers | | US20030152802 |
| | | U.S. Pat. No. 7,090,928 |
| Blue dopants | | |
| Iridium(III) organometallic complexes | | WO2002002714 |
| | | WO2006009024 |
| | | US20060251923 |

TABLE 1-continued

| MATERIAL | EXAMPLES OF MATERIAL | PUBLICATIONS |
|---|---|---|
| | | U.S. Pat. No. 7,393,599, WO2006056418, US20050260441, WO2005019373 |
| | | U.S. Pat. No. 7,534,505 |
| | | U.S. Pat. No. 7,445,855 |
| | | US20070190359, US20080297033 |
| | | U.S. Pat. No. 7,338,722 |
| | | US20020134984 |

TABLE 1-continued

| MATERIAL | EXAMPLES OF MATERIAL | PUBLICATIONS |
| --- | --- | --- |
| | | Angew. Chem. Int. Ed. 47, 1 (2008) |
| | | Chem. Mater. 18, 5119 (2006) |
| | | Inorg. Chem. 46, 4308 (2007) |
| | | WO2005123873 |
| | | WO2005123873 |
| | | WO2007004380 |

TABLE 1-continued

| MATERIAL | EXAMPLES OF MATERIAL | PUBLICATIONS |
|---|---|---|
| | | WO2006082742 |
| Osmium(II) complexes | | U.S. Pat. No. 7,279,704 |
| | | Organometallics 23, 3745 (2004) |
| Gold complexes | | Appl. Phys. Lett. 74, 1361 (1999) |
| Platinum(II) complexes | | WO2006098120, WO2006103874 |

TABLE 1-continued
| MATERIAL | EXAMPLES OF MATERIAL | PUBLICATIONS |
|---|---|---|
| | Exciton/hole blocking layer materials | |
| Bathocuprine compounds (e.g., BCP, BPhen) | 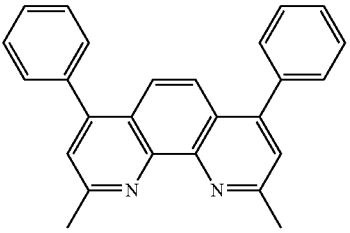 | Appl. Phys. Lett. 75, 4 (1999) |
| | | Appl. Phys. Lett. 79, 449 (2001) |
| Metal 8-hydroxyquinolates (e.g., BAlq) | 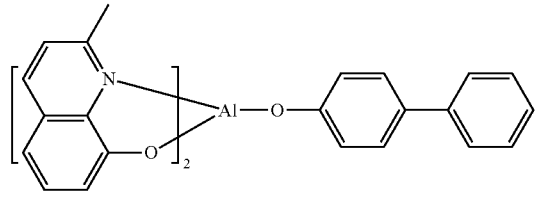 | Appl. Phys. Lett. 81, 162 (2002) |
| 5-member ring electron dificient heterocycles such as triazole, oxadiazole, imidazole, benzoimidazole | 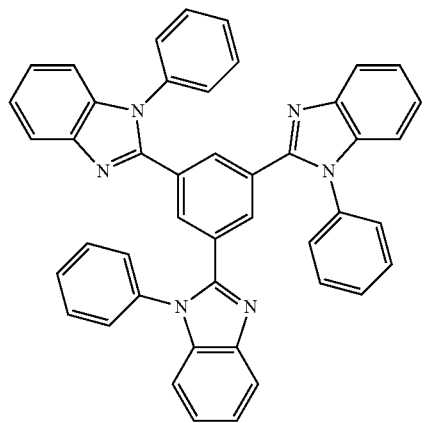 | Appl. Phys. Lett. 81, 162 (2002) |

TABLE 1-continued
| MATERIAL | EXAMPLES OF MATERIAL | PUBLICATIONS |
|---|---|---|
| Triphenylene compounds | 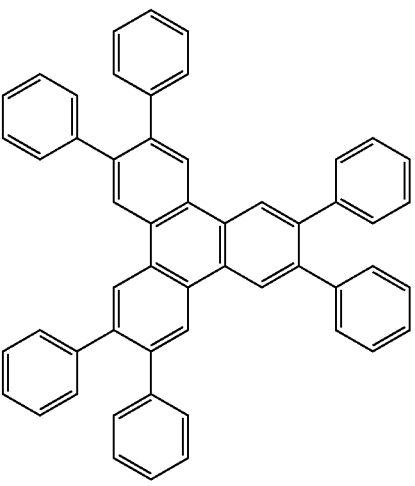 | US20050025993 |
| Fluorinated aromatic compounds | 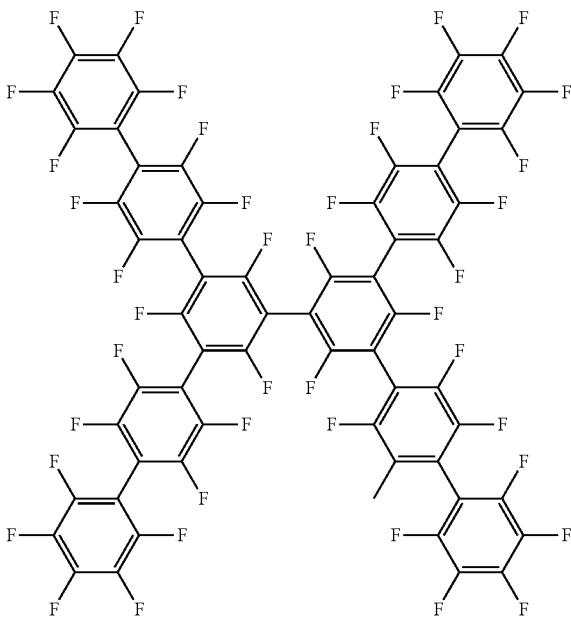 | Appl. Phys. Lett. 79, 156 (2001) |
| Phenothiazine-S-oxide | 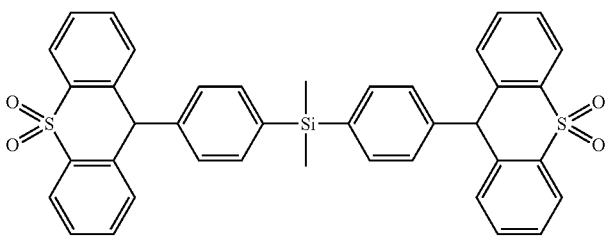 | WO2008132085 |

TABLE 1-continued

| MATERIAL | EXAMPLES OF MATERIAL | PUBLICATIONS |
| --- | --- | --- |
| Electron transporting materials | | |
| Anthracene-benzoimidazole compounds | | WO2003060956 |
| | | US20090179554 |
| Aza triphenylene derivatives | | US20090115316 |
| Anthracene-benzothiazole compounds | | Appl. Phys. Lett. 89, 063504 (2006) |
| Metal 8-hydroxyquinolates (e.g., Alq$_3$, Zrq$_4$) | | Appl. Phys. Lett. 51, 913 (1987)<br>U.S. Pat. No. 7,230,107 |

TABLE 1-continued
| MATERIAL | EXAMPLES OF MATERIAL | PUBLICATIONS |
|---|---|---|
| Metal hydroxybenoquinolates | 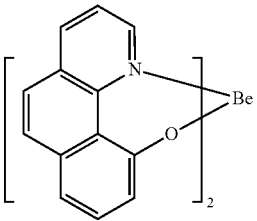 | Chem. Lett. 5, 905 (1993) |
| Bathocuprine compounds such as BCP, BPhen, etc | 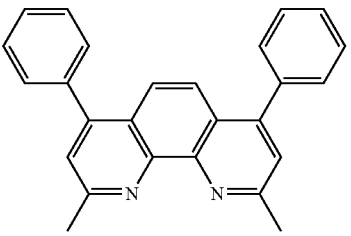 | Appl. Phys. Lett. 91, 263503 (2007) |
|  | 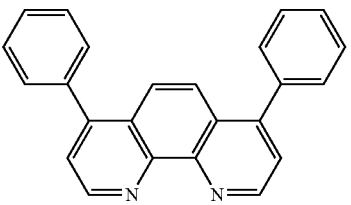 | Appl. Phys. Lett. 79, 449 (2001) |
| 5-member ring electron deficient heterocycles (e.g., triazole, oxadiazole, imidazole, benzoimidazole) | 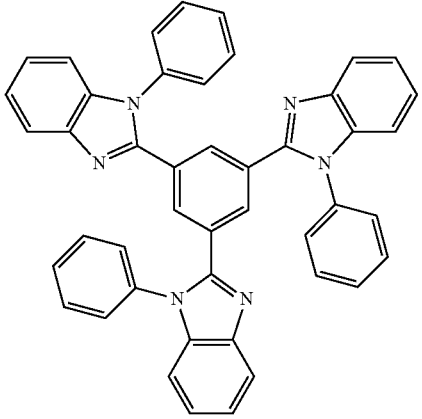 | Appl. Phys. Lett. 74, 865 (1999) |
|  | 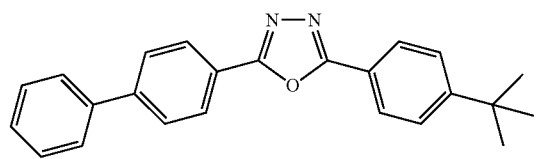 | Appl. Phys. Lett. 55, 1489 (1989) |
|  | 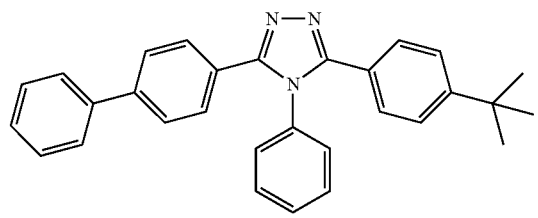 | Jpn. J. Apply. Phys. 32, L917 (1993) |

TABLE 1-continued
| MATERIAL | EXAMPLES OF MATERIAL | PUBLICATIONS |
|---|---|---|
| Silole compounds | 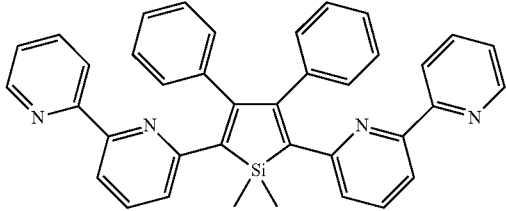 | Org. Electron. 4, 113 (2003) |
| Arylborane compounds | 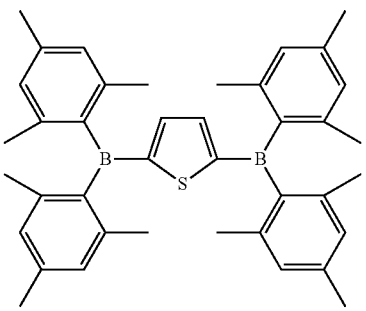 | J. Am. Chem. Soc. 120, 9714 (1998) |
| Fluorinated aromatic compounds | 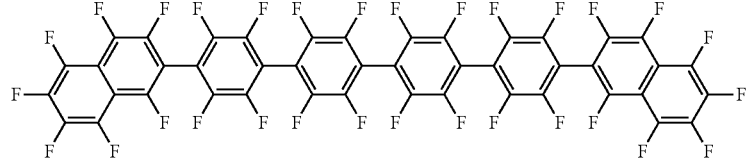 | J. Am. Chem. Soc. 122, 1832 (2000) |
| Fullerene (e.g., C60) | 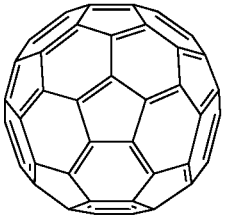 | US20090101870 |
| Triazine complexes | 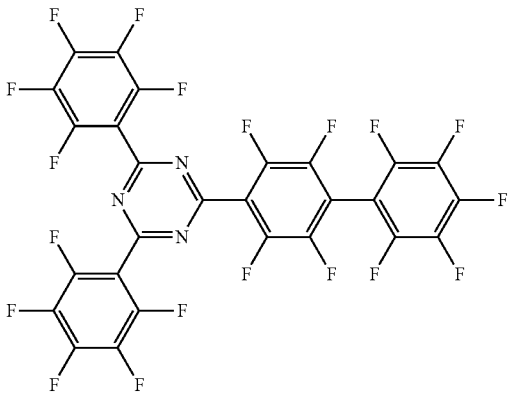 | US20040036077 |

TABLE 1-continued

| MATERIAL | EXAMPLES OF MATERIAL | PUBLICATIONS |
|---|---|---|
| Zn (N^N) complexes | | U.S. Pat. No. 6,528,187 |

EXPERIMENTAL

Compound Examples

Several of the compounds were synthesized as follows:

Example 1

Synthesis of Compound 1

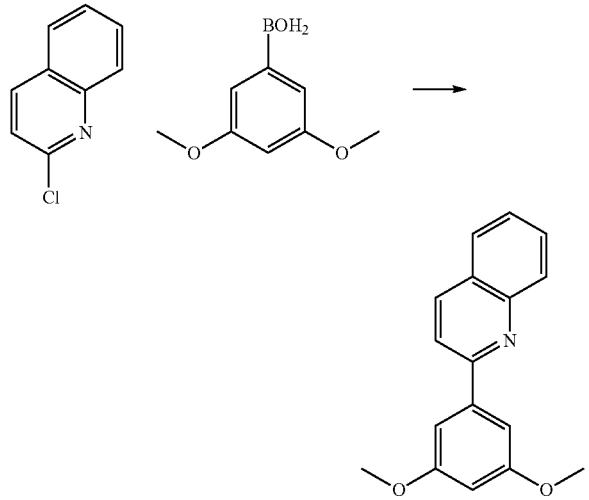

Step 1. 2-chloroquinoline (9.0 g, 54.4 mmol), 3,5-dimethoxyphenylboronic acid (9.2 g, 59.8 mmol), Pd(PPh$_3$)$_4$ (1.8 g, 1.5 mmol), K$_2$CO$_3$ (22.4 g, 163 mmol), 1,2-dimethoxyethane (150 mL) and water (150 mL) were charged in a 500 mL round bottom flask. The reaction mixture was heated to reflux under nitrogen for 18 h. The reaction mixture was then cooled to ambient and the organic phase was separated from the aqueous phase. The aqueous phase was washed with ethyl acetate and all the organic components were combined and dried over anhydrous magnesium sulphate. The solvent was then removed under vacuum and the product was purified using silica gel chromatography (10% ethyl acetate in hexane as eluent). The material obtained was further purified by vacuum distillation to yield 12.2 g (95% yield) of product as a colorless oil.

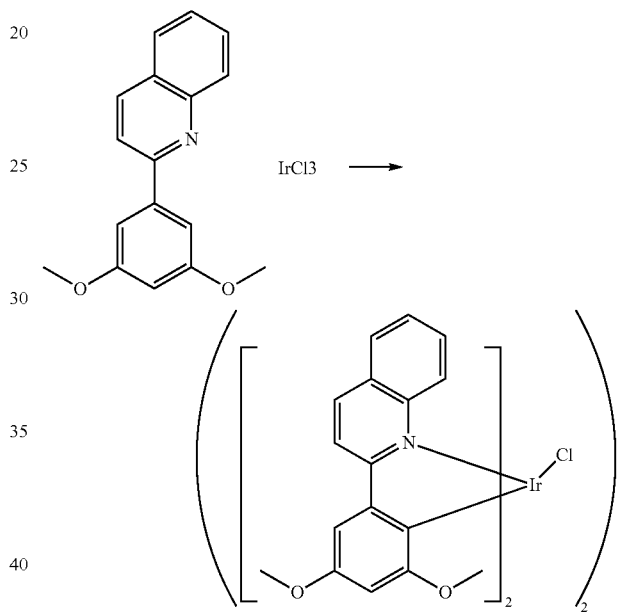

Step 2. The ligand from Step 1 (16.54 g, 71 mmol), 2-ethoxyethanol (250 mL) and water (50 mL) were charged in a 1 L three-neck round bottom flask. Nitrogen gas was bubbled through the reaction mixture for 45 minutes. IrCl$_3$.3H$_2$O (5.0 g, 15 mmol) was then added and the reaction mixture was heated to reflux under nitrogen for 17 h. The reaction mixture was cooled to ambient temperature. Approximately half of the solvent was removed on the rotary evaporator and 200 mL of ethoxyethanol was added to the reaction mixture. The iridium dimer was not isolated and the reaction mixture was used as is for the following step.

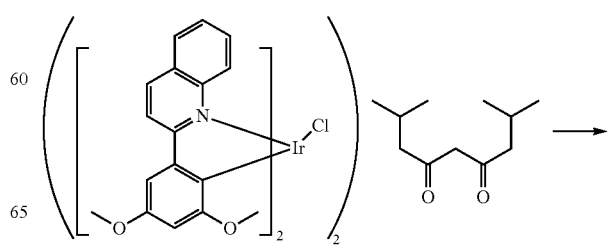

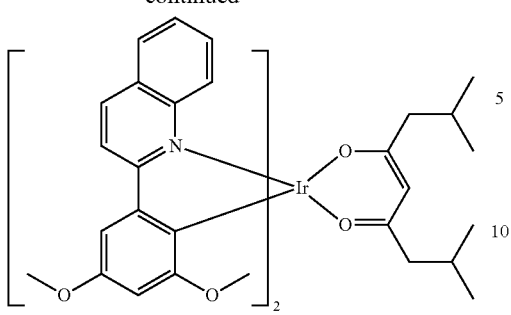

Step 3. 2,8-dimethylnonane-4,6-dione (28 g, 152 mmol) and Na$_2$CO$_3$ (16 g, 152 mmol) were added to the dichlorobridged Iridium dimer solution from Step 2. The reaction mixture was stirred at room temperature for 48 h. The solvent was removed on the rotary evaporator and the crude dissolved in dichloromethane. The solution was passed through a 1 inch thick silica gel plug to remove and salts. The solution was removed and the crude was purified using silica gel chromatography with dichloromethane and hexanes as the mobile phase to give 8.0 g of product (73.5% yield).

Example 2

Synthesis of Compound 2

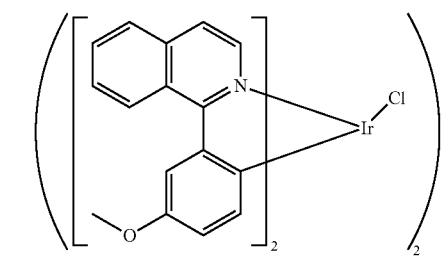

Step 1. 2-chloroquinoline (10.0 g, 61.3 mmol), 3-methoxyphenylboronic acid (9.2 g, 67.5 mmol), Pd(PPh$_3$)$_4$ (1.8 g, 1.5 mmol), K$_2$CO$_3$ (22.4 g, 163 mmol), 1,2-dimethoxyethane (150 mL) and water (150 mL) were charged in a 500 mL round bottom flask. The reaction mixture was heated to reflux under nitrogen for 18 h. The reaction mixture was then cooled to ambient temperature and the organic phase was separated from the aqueous phase. The aqueous phase was washed with ethyl acetate and all the organic components were combined and dried over anhydrous magnesium sulfate. The solvent was then removed under vacuum and the product was purified using silica gel chromatography (10% ethyl acetate in hexane as eluent). The material obtained was further purified by vacuum distillation to yield 13.0 g (90% yield) of product as a colorless oil.

Step 2. The ligand from Step 1 (10.0 g, 42.5 mmol), 2-ethoxyethanol (200 mL) and water (40 mL) were charged in a 1 L three-neck round bottom flask. Nitrogen gas was bubbled through the reaction mixture for 45 minutes. IrCl$_3$.3H$_2$O (4.0 g, 10.6 mmol) was then added and the reaction mixture was heated to reflux under nitrogen for 17 h. The reaction mixture was cooled to ambient temperature. Approximately half of the solvent was removed on the rotary evaporator and 200 mL of ethoxyethanol was added to the reaction mixture. The iridium dimer was not isolated and the reaction mixture was used as is for the following step.

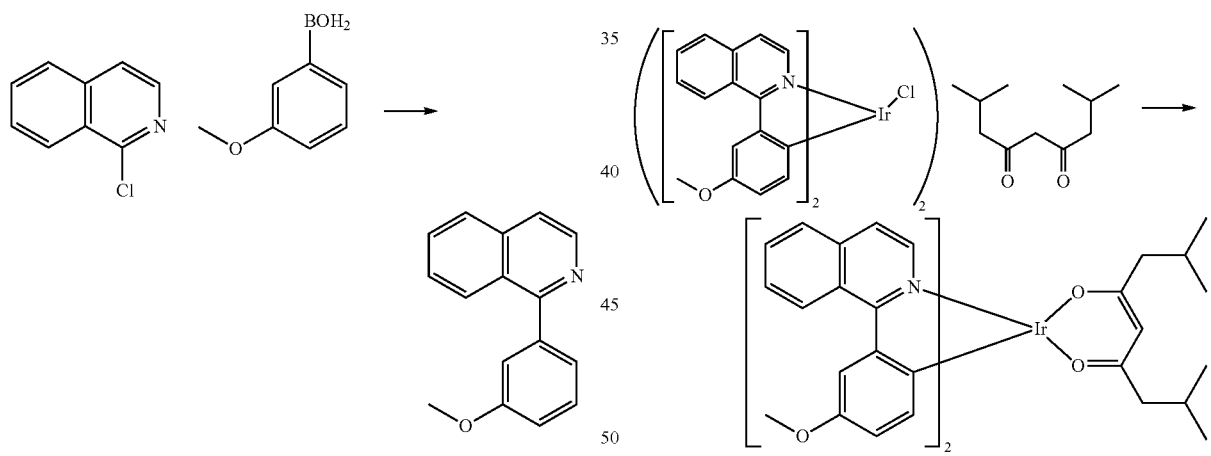

Step 3. 2,8-dimethylnonane-4,6-dione (20 g, 108 mmol) and Na$_2$CO$_3$ (11.23 g, 106 mmol) were added to the dichlorobridged Iridium dimer solution from Step 2. The reaction mixture was stirred at room temperature for 48 h. The solvent was removed on the rotary evaporator and the crude dissolved in dichloromethane. The solution was passed through a 1 inch thick silica gel plug to remove and salts. The solution was removed and the crude was purified using silica gel chromatography with dichloromethane and hexanes as the mobile phase to give 5.0 g of product (52% yield).

Device Examples

All device examples were fabricated by high vacuum (<10$^{-7}$ Torr) thermal evaporation. The anode electrode is 1200 Å of indium tin oxide (ITO). The cathode consisted of 10 Å of LiF followed by 1000 Å of Al. All devices were encapsulated with a glass lid sealed with an epoxy resin in a nitrogen glove box (<1 ppm of $H_2O$ and $O_2$) immediately after fabrication, and a moisture getter was incorporated inside the package.

The organic stack of the Device Example consisted of sequentially, from the ITO surface, 100 Å of hole injection layer (HIL), 300 Å of 4,4'-bis[N-(1-naphthyl)-N-phenylamino]biphenyl (α-NPD) as the hole transporting later (HTL), 300 Å of host (CBP or Compound D) doped with 9% of Compound 1-2 as the emissive layer (EML), and 400 Å of $Alq_3$ (tris-8-hydroxyquinoline aluminum) as the ETL.

As used herein, the following compounds have the following structures:

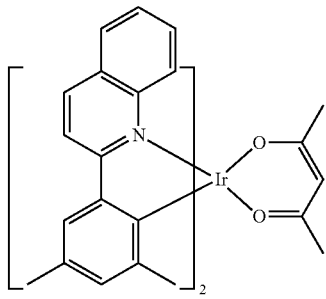

Compound A

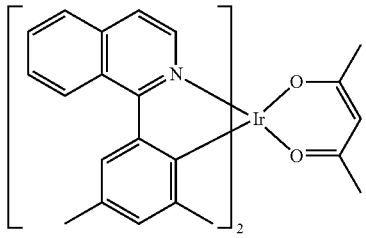

Compound B

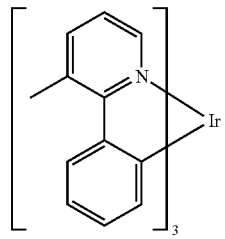

Compound C

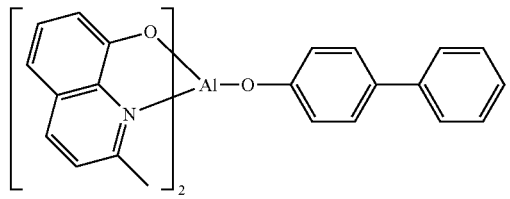

Compound D

Particular emissive dopants for the emissive layer of an OLED are provided. These compounds may lead to devices having particularly good properties. The device structures are provided in Table 2, and the corresponding device data is provided in Table 3.

TABLE 2

VTE PHOLEDs

| Device Example | HIL | HTL | EML | (doping %) | ETL |
|---|---|---|---|---|---|
| Example 1 | Compound C | α-NPD | Compound D | Compound 1 (9%) | $Alq_3$ |
| Example 2 | Compound C | α-NPD | Compound D | Compound 2 (9%) | $Alq_3$ |
| Comparative Example 1 | Compound C | α-NPD | CBP | Compound A (9%) | $Alq_3$ |
| Comparative Example 2 | Compound C | α-NPD | Compound D | Compound B (9%) | $Alq_3$ |

TABLE 3

VTE Device data

| | CIE | | | | At 1000 cd/m2 | | | | at J = 40 mA/cm2 | |
|---|---|---|---|---|---|---|---|---|---|---|
| Device Example | λmax (nm) | FWHM (nm) | CIE (x) | CIE (y) | V [V] | LE (cd/A) | EQE (%) | PE (lm/W) | LE/ EQE | $L_0$, (cd/m$^2$) | $RT_{80\%}$ (h) |
| Example 1 | 672 | 81 | 0.71 | 0.29 | 15 | 1.1 | 5.8 | 0.2 | 0.2 | 546 | 60 |
| Example 2 | 685 | 98 | 0.71 | 0.28 | 16.8 | 0.5 | 4.1 | 0.1 | 0.1 | 321 | 200 |

TABLE 3-continued

| | | | | | | At 1000 cd/m2 | | | at J = 40 mA/cm2 | |
|---|---|---|---|---|---|---|---|---|---|---|
| | | | CIE | | | | | | | |
| Device Example | λmax (nm) | FWHM (nm) | CIE (x) | CIE (y) | V [V] | LE (cd/A) | EQE (%) | PE (lm/W) | LE/ EQE | $L_0$, $(cd/m^2)$ | $RT_{80\%}$ (h) |
| Comparative Example 1 | 622 | 62 | 0.67 | 0.33 | 8.1 | 19.9 | 18.9 | 7.7 | 1.1 | 6447 | 888 |
| Comparative Example 2 | 636 | 64 | 0.70 | 0.30 | 9.9 | 10.5 | 18.5 | 3.3 | 0.6 | 3408 | 799 |

In particular, Device Examples 1 and 2 are significantly red shifted (>40 nm) from Comparative Example 1 and Comparative Example 2. This suggests that having 2 strong electron donating alkoxy groups compared to alkyl groups causes a marked reduction in the HOMO-LUMO gap, resulting in low energy emission in the deep red part of the visible spectrum.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A compound having a formula:

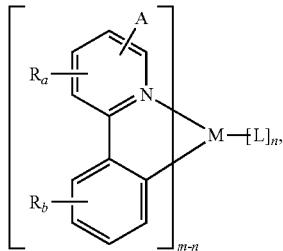

Formula I wherein M is a metal having an atomic weight higher than 40;
wherein L is an ancillary ligand;
wherein m is the oxidation state of the metal M;
wherein n is at least 1;
wherein A is a fused carbocyclic or fused heterocyclic ring;
wherein each of $R_a$ and $R_b$ may represent mono, di, tri, or tetra substituents;
wherein each $R_a$ substituent is independently selected from the group consisting of hydrogen, deuterium, alkyl, heteroalkyl, aryl or heteroaryl groups;
wherein each $R_b$ substituent is independently selected from the group consisting of hydrogen, deuterium, alkyl, heteroalkyl, aryl or heteroaryl groups; and
wherein at least two $R_b$ substituents are selected from the group consisting of alkoxy, aryloxy, alkyl amino, and aryl amino.

2. The compound of claim 1, wherein M is Ir.

3. The compound of claim 1, wherein L is a monoanionic bidentate ligand.

4. The compound of claim 1, wherein L is

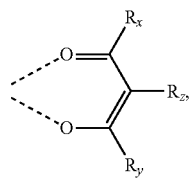

and wherein $R_x$, $R_y$, and $R_z$, are each independently selected from the group consisting of hydrogen, deuterium, alkyl, heteroalkyl, aryl or heteroaryl groups.

5. The compound of claim 1, wherein the compound has a formula selected from the group consisting of:

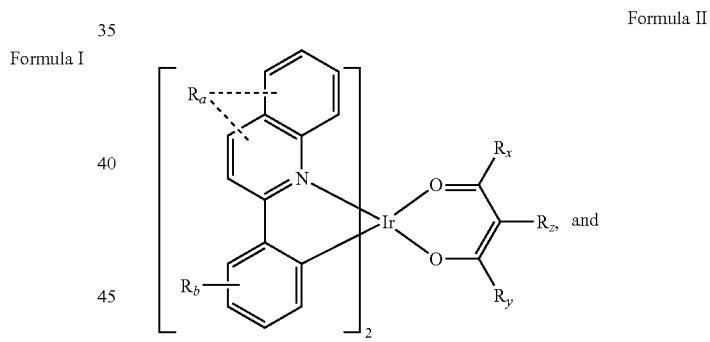

Formula II

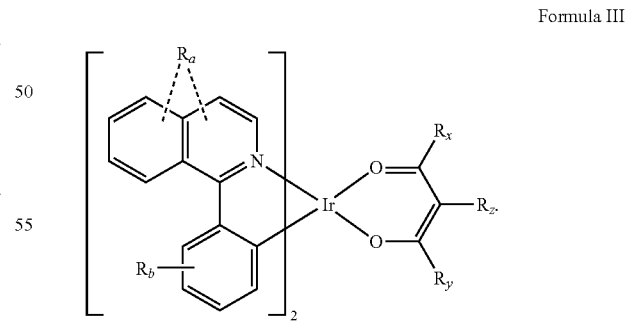

Formula III

6. The compound of claim 5, wherein at least one of $R_x$ and $R_y$ contains a branched alkyl moiety with branching at a position further than the α position to the carbonyl group.

7. The compound of claim 5, wherein at least one of $R_x$ and $R_y$ is isobutyl.

8. The compound of claim 5, wherein $R_z$ is hydrogen.

9. The compound of claim 1, wherein the (iso)pq ligand is selected from the group consisting of:
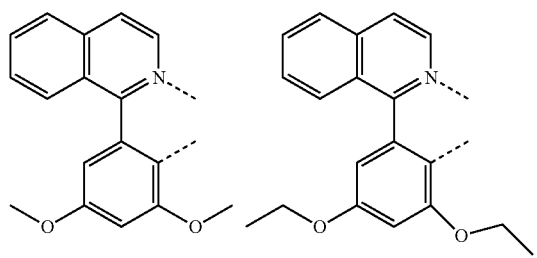
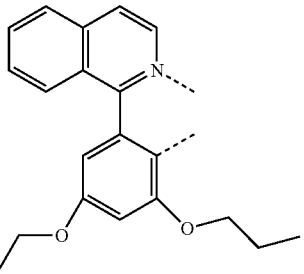
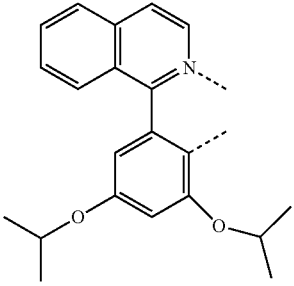
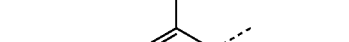
-continued
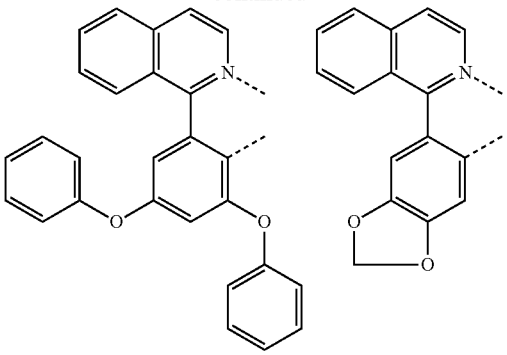
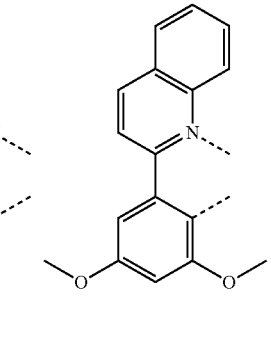
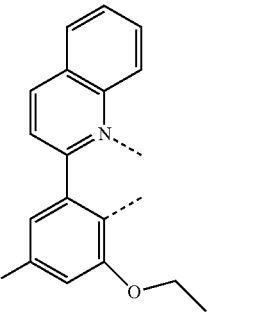
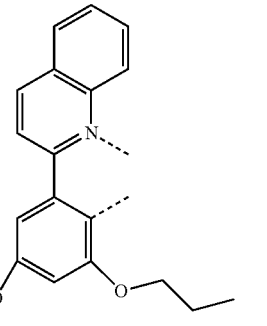
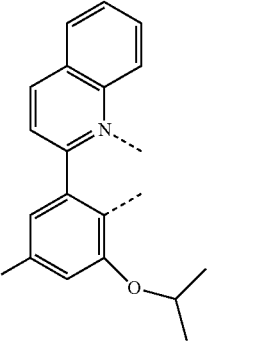

121
-continued
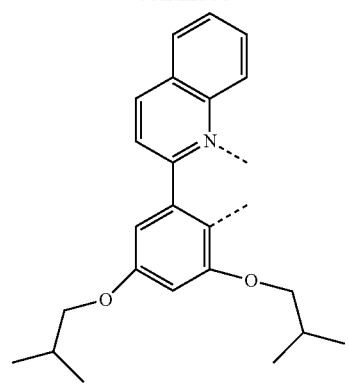
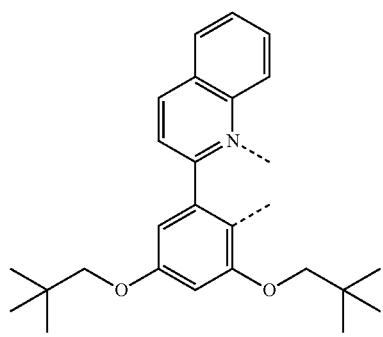
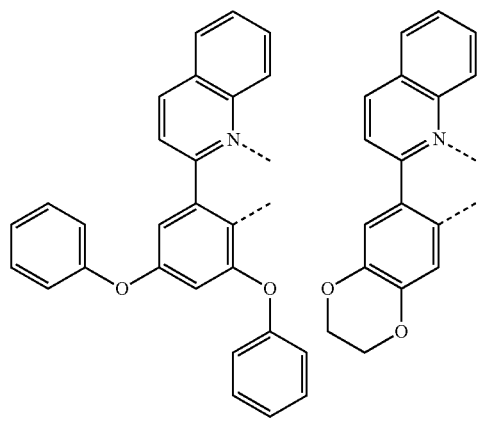
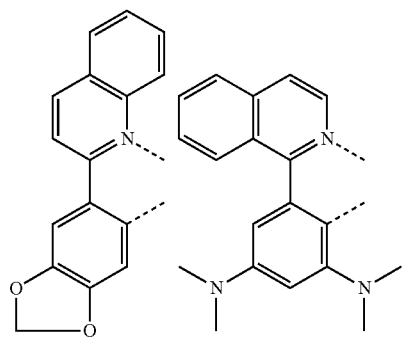
122
-continued
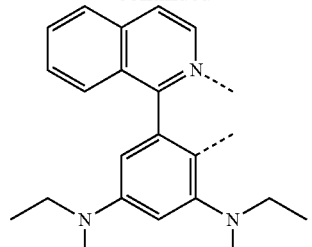
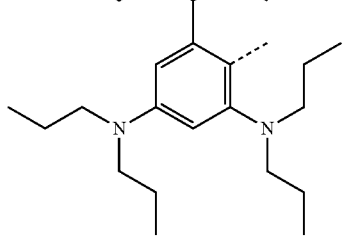
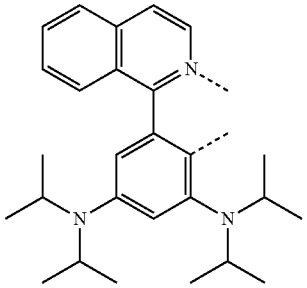
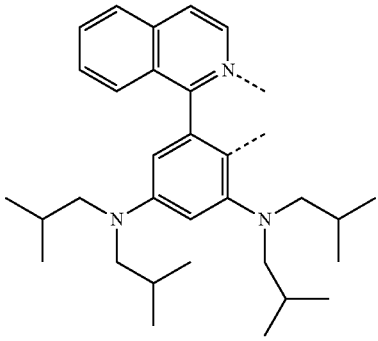
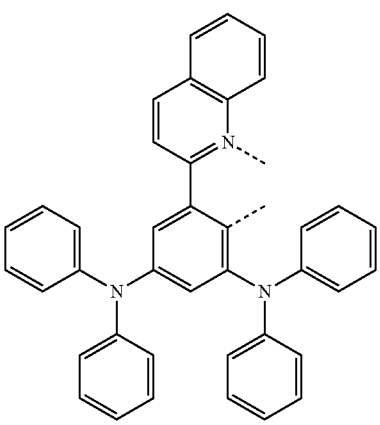

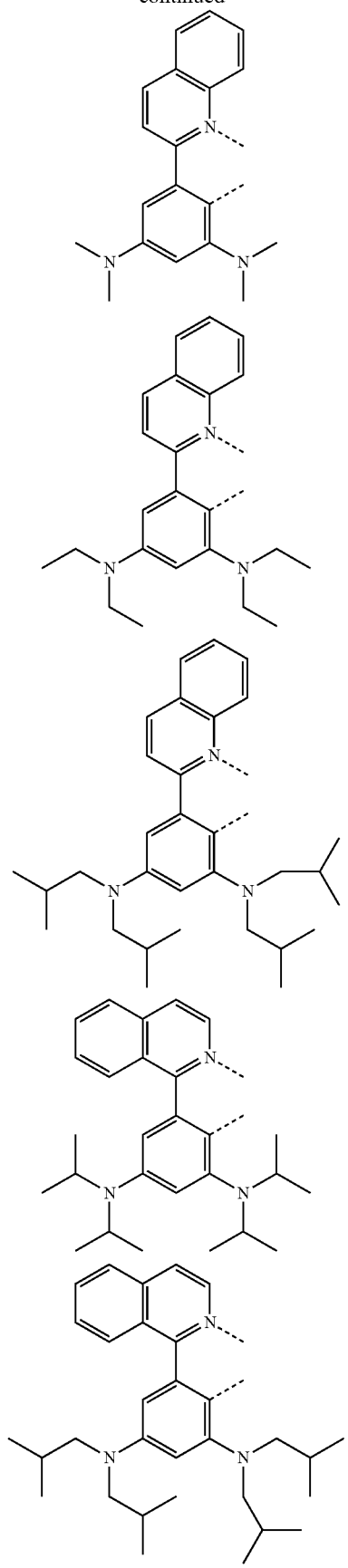
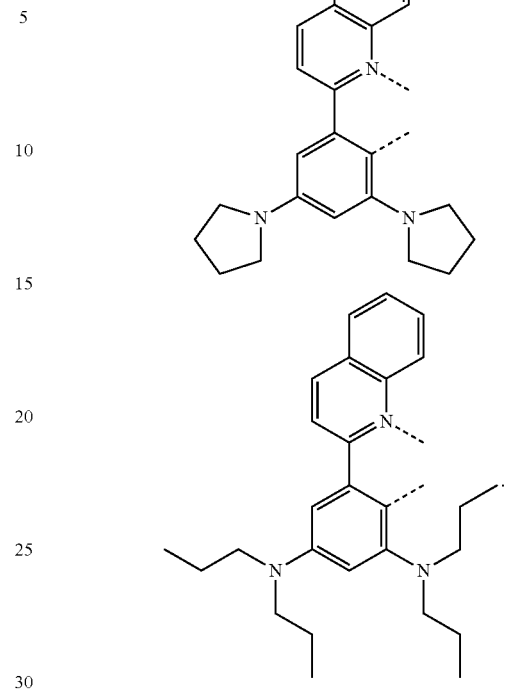
10. The compound of claim 1, wherein the compound is selected from the group consisting of:
Compound 1
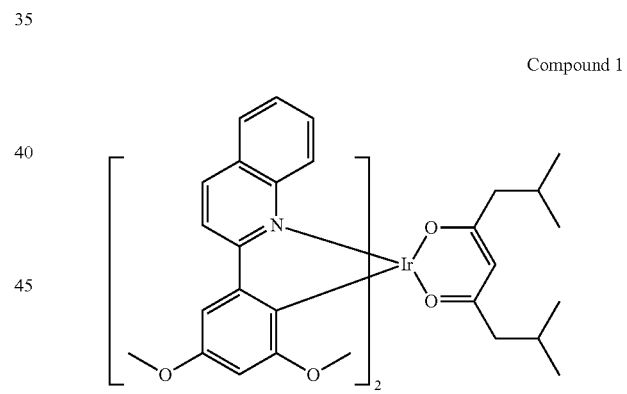
Compound 2
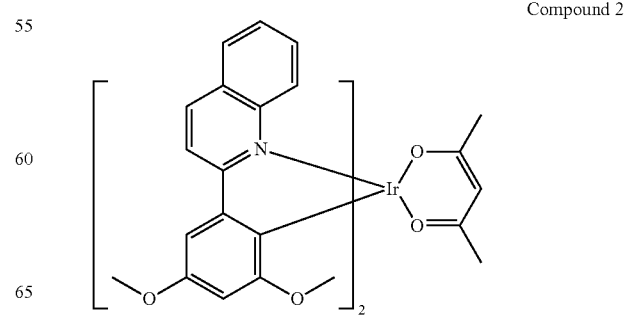

-continued

Compound 3

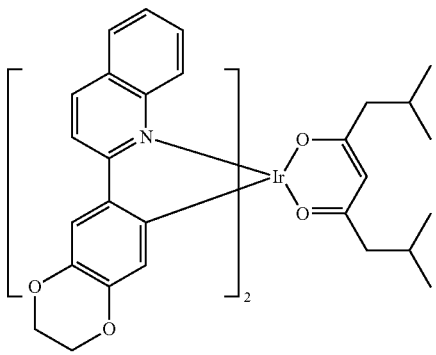

Compound 4

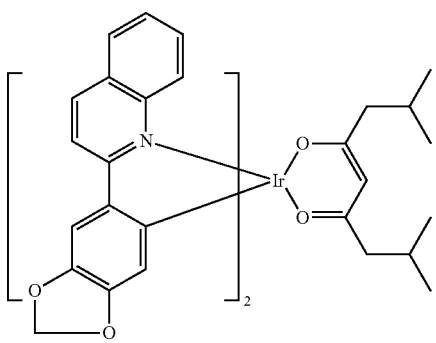

Compound 5

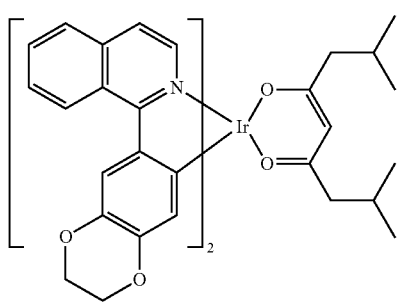

Compound 6

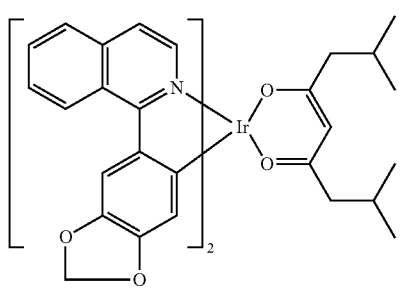

-continued

Compound 7

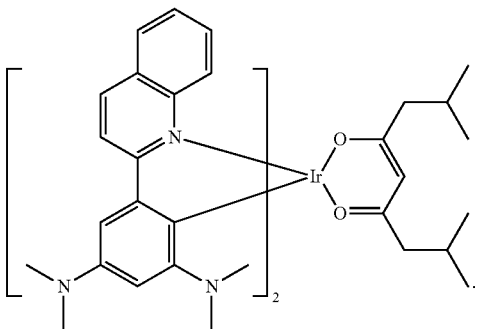

11. The compound of claim 1, wherein the compound has an emissive spectrum having a peak wavelength of about 650 nm to about 700 nm.

12. A first device, comprising an organic light emitting device further comprising:
   an anode;
   a cathode; and
   an organic layer, disposed between the anode and the cathode, comprising a compound having a formula:

Formula I

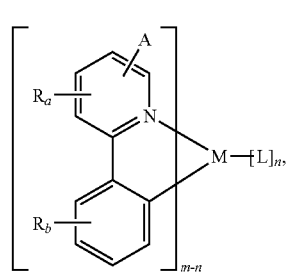

wherein M is a metal having an atomic weight higher than 40;
wherein L is an ancillary ligand;
wherein m is the oxidation state of the metal M;
wherein n is at least 1;
wherein A is a fused carbocyclic or fused heterocyclic ring;
wherein each of $R_a$ and $R_b$ may represent mono, di, tri, or tetra substituents;
wherein each $R_a$ substituent is independently selected from the group consisting of hydrogen, deuterium, alkyl, heteroalkyl, aryl or heteroaryl groups;
wherein each $R_b$ substituent is independently selected from the group consisting of hydrogen, deuterium, alkyl, heteroalkyl, aryl or heteroaryl groups; and
wherein at least two $R_b$ substituents are selected from the group consisting of alkoxy, aryloxy, alkyl amino, and aryl amino.

13. The first device of claim 12, wherein M is Ir.

14. The first device of claim 12, wherein L is a monoanionic bidentate ligand.

15. The first device of claim 12, wherein L is

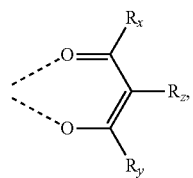

and wherein $R_x$, $R_y$, and $R_z$ are each independently selected from the group consisting of hydrogen, deuterium, alkyl, heteroalkyl, aryl or heteroaryl groups.

16. The first device of claim 12, wherein the compound has a formula selected from the group consisting of:

Formula II

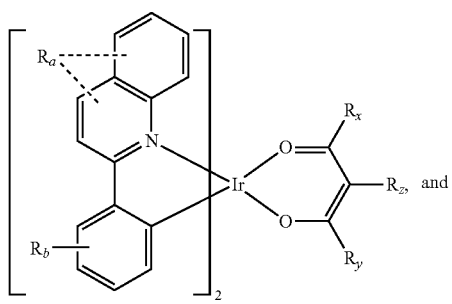

Formula III

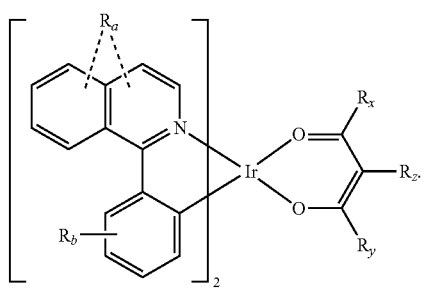

17. The first device of claim 16, wherein at least one of $R_x$ and $R_y$ contains a branched alkyl moiety with branching at a position further than the α position to the carbonyl group.

18. The first device of claim 16, wherein at least one of $R_x$ and $R_y$ is isobutyl.

19. The first device of claim 16, wherein $R_z$ is hydrogen.

20. The first device of claim 12, wherein the (iso)pq ligand is selected from the group consisting of:

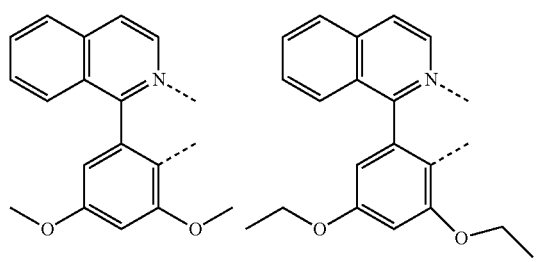

-continued

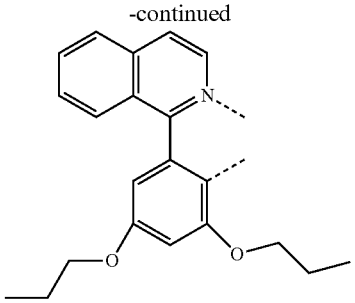

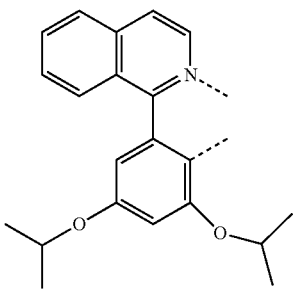

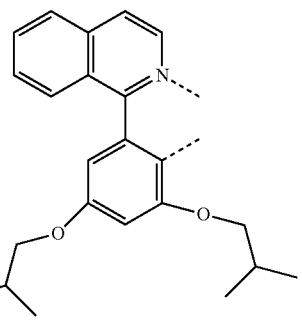

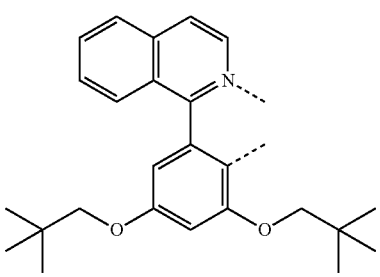

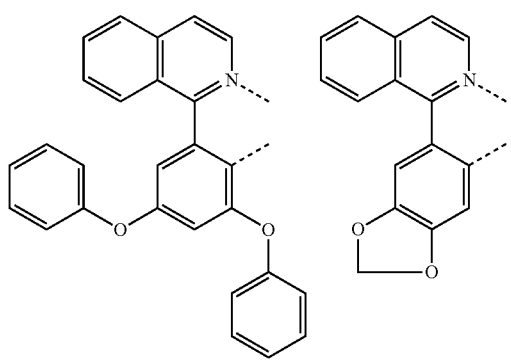

129
-continued
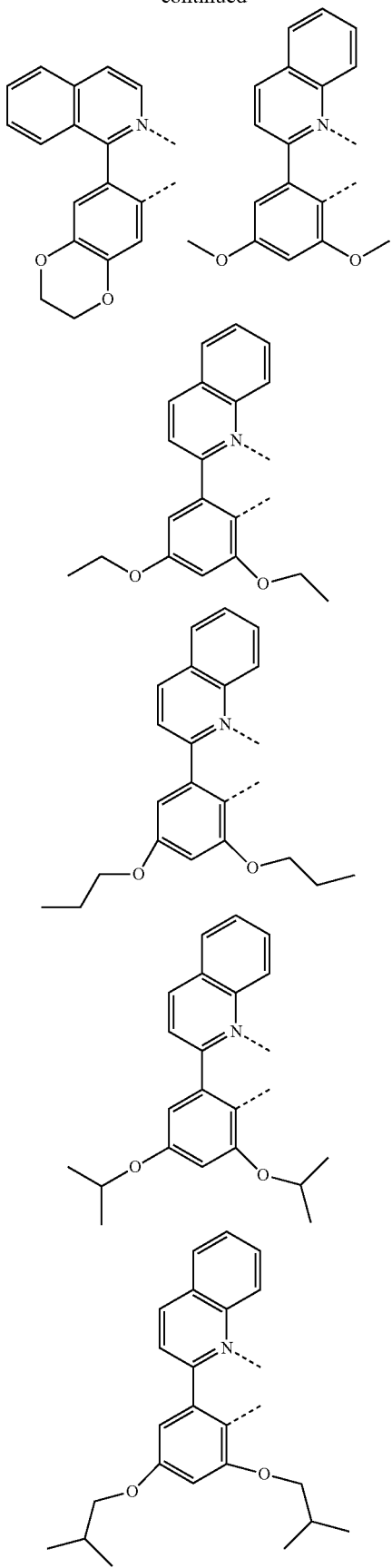
130
-continued
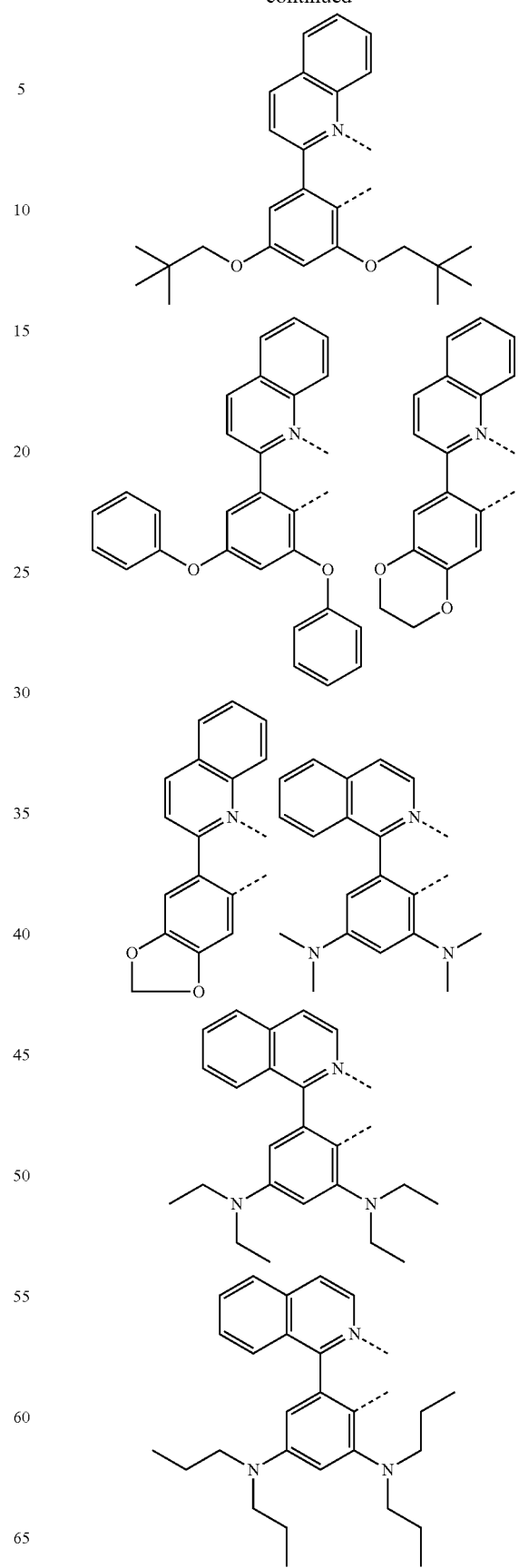

| 131 -continued | 132 -continued |
|---|---|
| 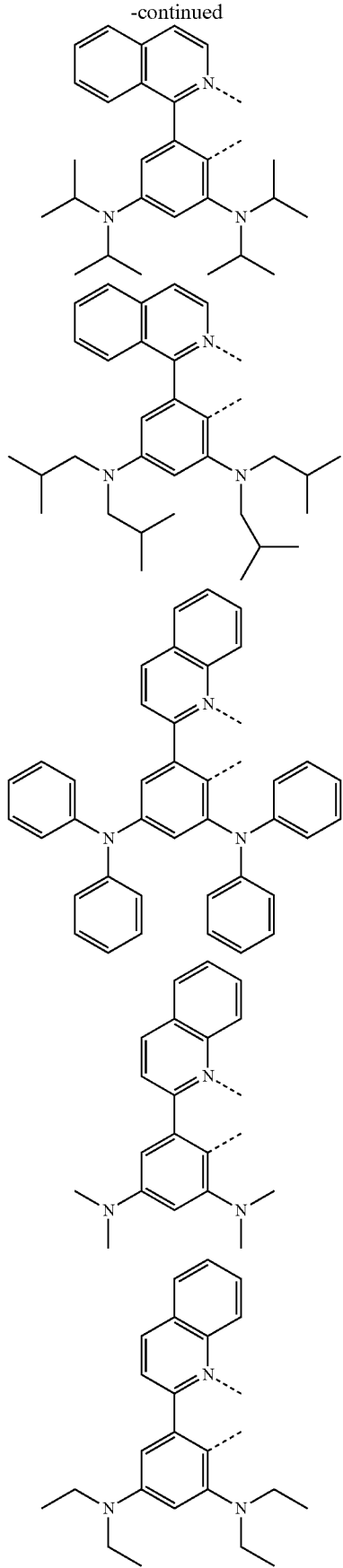 | 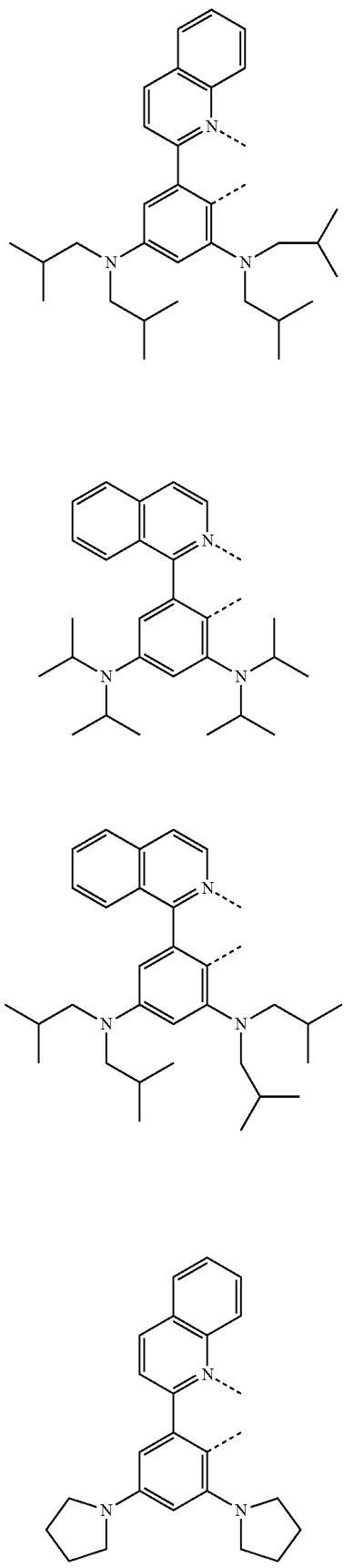 |

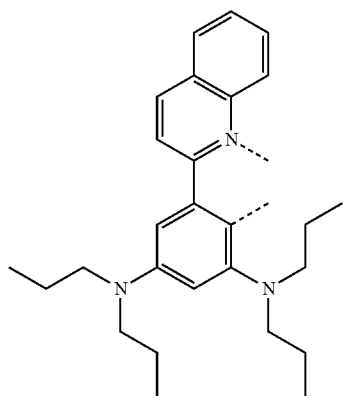

21. The first device of claim 12, wherein the compound is selected from the group consisting of:

Compound 1

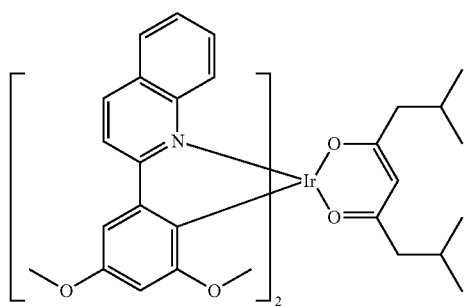

Compound 2

Compound 3

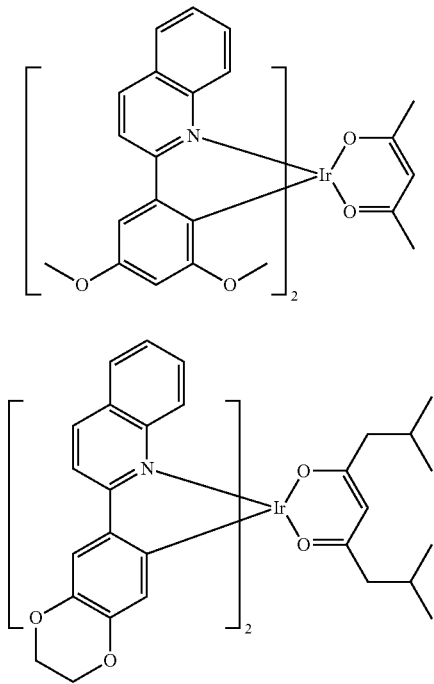

Compound 4

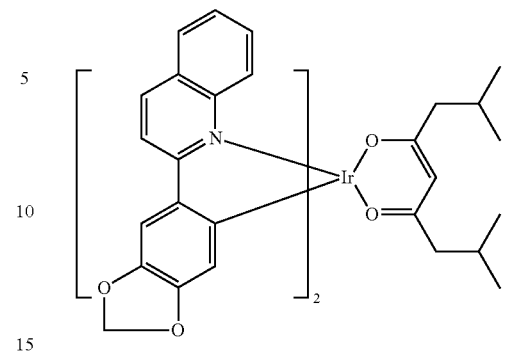

Compound 5

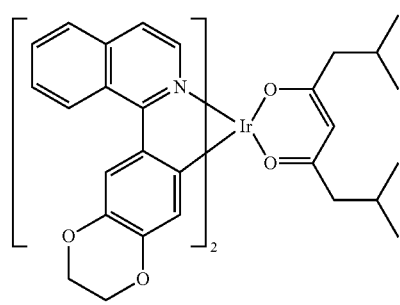

Compound 6

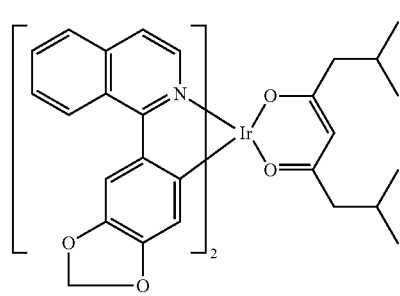

Compound 7

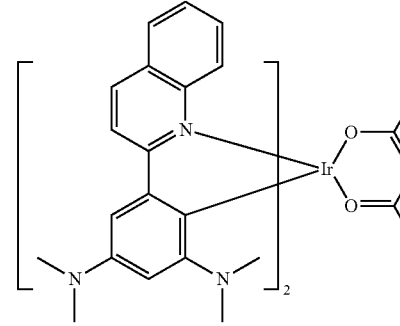

22. The first device of claim 12, wherein the organic layer is an emissive layer and the compound having Formula I is an emitting dopant.

23. The first device of claim 22, wherein the organic layer further comprises a host.

24. The first device of claim 23, wherein the hose is a metal 8-hydroxyquinolate.

25. The first device of claim 23, wherein the host is:
Compound D
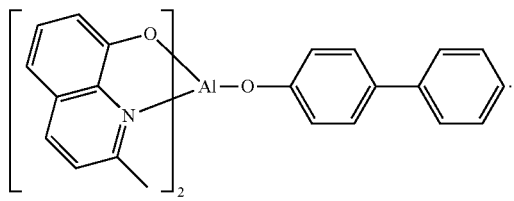
26. The first device of claim 12, wherein the first device is a consumer product.
27. The first device of claim 12, wherein the first device is an organic light emitting device.
28. The first device of claim 12, wherein the compound has an emissive spectrum having a peak wavelength of about 650 nm to about 700 nm.
* * * * *